(12) United States Patent
Sato et al.

(10) Patent No.: US 9,956,634 B2
(45) Date of Patent: May 1, 2018

(54) DEVICE FOR COATING THIN MOLTEN SOLDER FILM, THIN SOLDER FILM-COVERED COMPONENT AND MANUFACTURING METHOD THEREFOR

(71) Applicant: Senju Metal Industry Co., Ltd., Tokyo (JP)

(72) Inventors: Isamu Sato, Saitama (JP); Koji Watanabe, Tochigi (JP); Kota Kikuchi, Tokyo (JP); Michio Suzuki, Tochigi (JP); Naoto Kameda, Tochigi (JP); Hideki Nakamura, Saitama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 656 days.

(21) Appl. No.: 14/407,040

(22) PCT Filed: Jun. 10, 2013

(86) PCT No.: PCT/JP2013/065953
§ 371 (c)(1),
(2) Date: Dec. 10, 2014

(87) PCT Pub. No.: WO2013/187362
PCT Pub. Date: Dec. 9, 2013

(65) Prior Publication Data
US 2015/0174678 A1   Jun. 25, 2015

(30) Foreign Application Priority Data

Jun. 11, 2012   (JP) ................................. 2012-132094

(51) Int. Cl.
*B23K 1/08*   (2006.01)
*C23C 2/04*   (2006.01)
(Continued)

(52) U.S. Cl.
CPC .............. *B23K 3/0676* (2013.01); *B23K 1/08* (2013.01); *B23K 1/20* (2013.01); *B23K 31/02* (2013.01);
(Continued)

(58) Field of Classification Search
CPC ................................. C23C 2/003; C23C 2/08
(Continued)

(56) References Cited

U.S. PATENT DOCUMENTS 3,499,418 A   3/1970   Mayhew
3,607,366 A   9/1971   Kurokawa
(Continued)

FOREIGN PATENT DOCUMENTS

EP   2166124 A1   3/2010
JP   04-308071   10/1992
(Continued)

OTHER PUBLICATIONS

English machine translation of JP H05-106006, EPO, accessed May 3, 2017.*
(Continued)

*Primary Examiner* — Humera N Sheikh
*Assistant Examiner* — Xiaobei Wang
(74) *Attorney, Agent, or Firm* — Chernoff, Vilhauer, McClung & Stenzel, LLP

(57) ABSTRACT

A hot-dip plating apparatus for plating a thin molten solder film can control a film thickness of a molten solder on a base material evenly and in increments of a few μm and achieve a thin-film solder plating having a film thickness less than a conventional system. As shown in FIG. 1, this apparatus comprises a solder bath 17 of accommodating the molten solder 7; a second conveying section 23 for drawing up a strip member 31 from the solder bath; and a blower section 19 for blowing hot gas on the strip member 31 immediately (Continued)

after being drawn up from the solder bath by a second conveying section 23; the hot gas having a predetermined flow volume and a predetermined temperature equal to or higher than a melting temperature of the molten solder 7. According to this configuration, the excess molten solder 7 can be trimmed from the strip member 31 corresponding to composition of the molten solder 7. Thus, the film thickness of the molten solder 7 coated on the strip member 31 can be controlled evenly and in increments of a few μm.

5 Claims, 25 Drawing Sheets

(51) Int. Cl.
*B23K 3/06* (2006.01)
*B23K 1/20* (2006.01)
*B23K 31/02* (2006.01)
*H05K 3/34* (2006.01)
*C23C 2/00* (2006.01)
*C23C 2/16* (2006.01)
*C23C 2/36* (2006.01)
*C23C 2/10* (2006.01)
*C23C 2/20* (2006.01)
*H01L 23/552* (2006.01)
*H05K 1/02* (2006.01)

(52) U.S. Cl.
CPC ............... *C23C 2/003* (2013.01); *C23C 2/04* (2013.01); *C23C 2/10* (2013.01); *C23C 2/16* (2013.01); *C23C 2/20* (2013.01); *C23C 2/36* (2013.01); *H05K 3/3468* (2013.01); *H01L 23/552* (2013.01); *H01L 2924/0002* (2013.01); *H05K 1/0216* (2013.01); *H05K 2203/044* (2013.01); *H05K 2203/1545* (2013.01); *Y10T 428/12701* (2015.01)

(58) Field of Classification Search
USPC .......................... 228/259; 427/329; 118/423
See application file for complete search history.

(56) References Cited

U.S. PATENT DOCUMENTS

| | | | |
|---|---|---|---|
| 3,865,298 | A | 2/1975 | Allen et al. |
| 4,083,323 | A | 4/1978 | Rote |
| 4,608,941 | A | 9/1986 | Morris |
| 6,042,648 | A | 3/2000 | Corey et al. |
| 2014/0366802 | A1 | 12/2014 | Itoh et al. |

FOREIGN PATENT DOCUMENTS

| | | | |
|---|---|---|---|
| JP | 05-106006 | A | 4/1993 |
| JP | 06-248408 | A | 9/1994 |
| JP | 09-214115 | A | 8/1997 |
| JP | 10-178265 | A | 6/1998 |
| JP | 11-300471 | A | 11/1999 |
| JP | 2000-087204 | | 3/2000 |
| JP | 2002-184240 | | 6/2002 |
| JP | 2011-228608 | A | 11/2011 |
| WO | 2013080910 | A1 | 6/2013 |

OTHER PUBLICATIONS

English machine translation of JP H04-308071, EPO, accessed May 3, 2017.*
English translation of International Preliminary Report on Patentability for corresponding International application No. PCT/JP2013/065953, dated Oct. 8, 2014, 4 pgs.
Supplementary European Search Report issued by the European Patent Office for EP 13804275 dated Oct. 22, 015, 3 pages.

* cited by examiner

| MULTI-ELEMENT CHEMICAL COMPOSITION OF MOLTEN SOLDER | | |
|---|---|---|
| TARGET FILM THICKNESS $\Delta t [\mu m]$ | N2 GAS FLOW RATE Q[NL/min] | HOT GAS TEMPERATURE T[°C] |
| 1.5~2.0 | Q1 | T1 |
| 1.0~1.5 | Q2 | T2 |
| 0.5~1.0 | Q3 | T3 |
| 0.0~0.5 | Q4 | T4 |

FeKa1

CoKa1

NiKa1

SnLa1

PbKa1

BiMa1

InLa1

AgLa1

| SPECTRUM | Fe | Co | Ni | Ag | In | Sn | Pb | Bi | TOTAL |
|---|---|---|---|---|---|---|---|---|---|
| SPECTRUM 1 | 0.00 | 0.00 | 0.00 | 0.00 | 2.90 | 85.14 | 11.16 | 0.00 | 100.00 |
| SPECTRUM 2 | 0.00 | 0.00 | 0.00 | 0.00 | 2.83 | 2.47 | 94.70 | 0.00 | 100.00 |
| SPECTRUM 3 | 1.58 | 0.00 | 0.00 | 0.00 | 2.58 | 2.64 | 93.19 | 0.00 | 100.00 |
| SPECTRUM 4 | 2.49 | 0.00 | 18.12 | 0.00 | 2.06 | 30.91 | 46.42 | 0.00 | 100.00 |
| SPECTRUM 5 | 3.87 | 0.00 | 96.13 | 0.00 | 0.00 | 0.00 | 0.00 | 0.00 | 100.00 |
| SPECTUM 6 | 52.96 | 17.16 | 29.88 | 0.00 | 0.00 | 0.00 | 0.00 | 0.00 | 100.00 |

FeKa1

CoKa1

NiKa1

SnLa1

PbKa1

BiMa1

InLa1

AgLa1

| SPECTRUM | Ag | In | Sn | Pb | Bi | TOTAL |
|---|---|---|---|---|---|---|
| SPECTRUM 2 | 0.00 | 2.74 | 4.24 | 93.02 | 0.00 | 100.00 |
| SPECTRUM 3 | 0.00 | 2.64 | 3.50 | 87.58 | 3.90 | 100.00 |
| SPECTRUM 4 | 0.00 | 2.40 | 3.48 | 94.12 | 0.00 | 100.00 |
| SPECTRUM 5 | 0.00 | 2.59 | 5.14 | 92.27 | 0.00 | 100.00 |

DEVICE FOR COATING THIN MOLTEN SOLDER FILM, THIN SOLDER FILM-COVERED COMPONENT AND MANUFACTURING METHOD THEREFOR

TECHNICAL FIELD

The present invention relates to a hot-dip plating apparatus for plating a thin molten solder film that can be applied to a system for manufacturing a thin solder film plated member by trimming an excess molten solder with hot gas blow and achieving a thin solder film plating on a base material. The present invention further relates to the thin solder film plated member obtained by the apparatus and relates to a manufacturing method thereof.

BACKGROUND

A shield case has been used for protecting electromagnetic wave interference between electronic parts and electronic circuits mounted on a printed circuit board in a high frequency operating electronic circuit, for blocking the electromagnetic effect thereof to the outside and for preventing malfunction thereof (EMI protection function). A frame is used for supporting the printed circuit board in an electronic equipment.

A copper member is generally used for the shield case. However, there are cases of using a metal member (hereinafter referred to as "base material") such as an albata material (Cu—Zn—Ni/C7521R, C7701R, etc.), stainless steel and other Kobar (Kovar/KOV-H; Fe—Ni—Co, etc.) from characteristic viewpoints of antimagnetic, anticorrosive, oxidation-resistant, heat expansion resistant and workability wherein Kobar is an alloy compounding nickel and cobalt to iron.

It is common that the base material as a case material, frame material, etc. has a predetermined width and elongated shape and is distributed under a condition that the base material is wound around a reel or the like in a roll (strip) type. The roll type wound base material is set to an automatic processing machine, is unreeled from the reel or the like, is punched out to a predetermined shape and is bending-processed to form the shield case or the frame.

As the electronic equipment is required to be compact and light weight and the electronic circuit is required to be high-density packaged, a method of plating (coating) the metal member as a material stage with the solder (hereinafter referred to as "solder coating method") is applied to the shield case and frame. In the base material, a finish processing is slightly difficult for the albata material but easy for Kovar. It is known that a solderability is slightly good for the albata material but hard for Kovar.

A coating method is proposed in a method of adhering the solder on the printed circuit board wherein a predetermined volume of the solder is adhered on a land of the printed circuit board on which electronic micro-parts such as flip-chip parts, BGA or the like and micro-QFP are mounted. In this coating method, after a resist is adhered on an area except of the land on the printed circuit board, the printed circuit board is dipped in the molten solder and ultrasonic sound wave is applied to the molten solder in order to adhere the solder to the land (refer to Patent Document 1).

Another coating method is disclosed to previously achieve the plating of the land on the printed circuit board, a lead of the electronic part or the like. In this disclosed method, a work of the printed circuit board, electronic part, etc. is dipped in the jet molten solder to which the ultrasonic sound wave is applied. Then, the work is moved horizontally or back and forth with respect to an ultrasonic sound wave horn and the work is pulled up from a molten solder bath (refer to Patent Document 2).

A solder pre-coated film forming method and an apparatus thereof are disclosed wherein a tin or solder pre-coated film is formed on a micro-area electrode pad or a narrow pitch lead surface of the electronic circuit board or electronic part (refer to Patent Document 3). In this approach, when it is drawn up from the molten solder bath, the excess adhered solder film is blown down by blowing heated organic aliphatic acid solution. In addition, a coating material of plating the molten solder on a longitudinal soldering material is disclosed (refer to Patent Document 4).

DOCUMENTS FOR PRIOR ART

Patent Documents

Patent Document 1: JP09-214115A
Patent Document 2: JP10-178265A
Patent Document 3: JP2011-228608A
Patent Document 4: JP11-300471A

SUMMARY OF THE INVENTION

Problem to be Solved by the Invention

In the conventional solder coating method such as the solder coating method disclosed by Patent Documents 1 and 2 and the pre-coat film forming method disclosed by Patent Document 3, the solder coating approach is discussed. This approach is that a predetermined volume of the solder is adhered on the land of the printed circuit board on which the electronic micro-parts such as the flip-chip parts, BGA, etc. and the micro-QFP are mounted. However, such method does not achieve to plate the base material having the predetermined width and longitudinal shape with the thin solder film. In addition, there are the following problems even if paying attention only to the solder plating.

In the solder coating method shown in Patent Documents 1 and 2 and the pre-coat covering method and the coating material shown in Patent Documents 3 and 4, it is not disclosed to control a film thickness of the solder adhered on the base material.

The inventor's experiment shows that a measured film thickness of the solidified solder layer cannot be less than 7 μm at one side under a condition that a conveying speed is, for example, 1 m/min. It is an actual status not to be capable of providing a thin solder film plated member having a solder layer of a thin-film thickness in response to a request of the compact and weight-saving electronic equipment having the shield case, frame, etc. and the high-density package of the electronic circuit.

By the way, an electroplating, non-electrolytic plating, etc. can plate the base material thinly in increment of a few microns but it takes a long time. In the molten solder plating, the plating time is shorter than the electroplating and the non-electrolytic plating but a problem is that the thin plating for the base material is impossible.

Means for Solving the Problems

In order to solve the above-described problems, a hot-dip plating apparatus for plating a thin molten solder film described in claim 1 is a hot-dip plating apparatus for plating a thin molten solder film that manufactures a thin solder film plated member by cooling down the base material after coating the washed base material with the molten solder heated to a predetermined temperature. This apparatus comprises a solder bath for, in an inactive atmosphere, accommodating the molten solder to coat with the solder by dipping the base material; a cover section for covering the upper portion of said solder bath and having an inlet port for the base material toward said solder bath and an outlet port from said solder bath; a bearing member provided in a unified manner with said cover section at the solder bath side of said cover section and supporting a shaft of a roller so as to turn around said base material to convey it from the inlet port of said cover section to the side of said solder bath and further convey it from to the outlet port from the side of said solder bath; a longitudinal member provided at a side of said solder bath facing said bearing member with respect to said cover member and being able to slide said cover section and said bearing member in a unified manner; a first conveying section provided at an upstream side of said solder bath for applying a predetermined tension to the base material that is to be conveyed to said solder bath under a condition of determining an inlet side of the base material as the upstream side and an outlet side of the base material as a downstream side; a second conveying section provided at the downstream side of said solder bath for conveying the tension applied base material while drawing up the base material from said solder bath at a predetermined speed; a blower section for blowing hot gas on the base material immediately after being drawn up from said solder bath by said second conveying section, the hot gas having a predetermined flow volume and a temperature set to be equal to or higher than a melting temperature corresponding to the composition of the molten solder; and a control section for controlling the temperature and flow volume of the hot gas to trim the molten solder from the base material so as to control the film thickness coated on the base material.

According to the hot-dip plating apparatus for plating the thin molten solder film of the present invention, the excess molten solder can be trimmed from the base material corresponding to the composition of the molten solder so that the thickness of the molten solder coated on the base material can be control evenly and in increments of a few μm.

The hot-dip plating apparatus for plating a thin molten solder film described in claim 3 comprises, in Claim 1, a cooling section for cooling down the base material whose film thickness is controlled by said control section.

The hot-dip plating apparatus for plating the thin molten solder film described in Claim 4 uses inactive gas as the hot gas in Claim 1.

A thin solder film plated member described in claim 6 is a thin solder film plated member comprising a base material and a coating layer consisting of a molten solder for coating the base material; wherein the molten solder heated to a predetermined temperature is accommodated in a solder bath in inactive atmosphere; the washed base material is conveyed to the molten solder bath at a predetermined speed through a bearing member and a longitudinal member under a condition where a predetermined tension is applied in the solder bath, said bearing member and said longitudinal member being provided in a unified manner with a cover section that covers an upper portion of the solder bath, said bearing member supporting a shaft of a roller that turns around the base material; the base material is dipped in the molten solder bath; hot gas is blown on the base material immediately after being drawn up from said solder bath; and the molten solder is trimmed from the base material so that the coating layer has a predetermined film thickness; the hot gas having a predetermined flow volume and a temperature set to be equal to or higher than a melting temperature corresponding to the composition of the molten solder.

A method of manufacturing a thin solder film plated member described in claim 7 is a method of manufacturing a thin solder film plated member by coating a washed base material with a molten solder heated to a predetermined temperature and then cooling down the base material. This method comprises a step of conveying the base material at a predetermined speed and dipping it in a solder bath in active atmosphere through a bearing member and a longitudinal member, a predetermined tension being applied to the base material, said bearing member and said longitudinal member being provided in a unified manner with a cover section that covers an upper portion of the solder bath, said bearing member supporting a shaft of a roller that turns around the base material; a step of drawing up the base material dipped in said solder bath from said solder bath; and a step of controlling a film thickness of the molten solder toward the thin-film solder coated member by blowing hot gas on the base material immediately after drawing up the base material in order to trim the molten solder from the base material, the hot gas being set to have a temperature equal to or higher than a melting temperature of the composition of the molten solder and being controlled to have a predetermined flow volume.

Effect of the Invention

The hot-dip plating apparatus for plating the thin molten solder film according to the present invention comprises the blower section for blowing the hot gas on the base material drawn up from the molten solder bath, the hot gas having the predetermined flow volume and the temperature equal to or higher than the melting temperature corresponding to the composition of the molten solder.

Since this configuration is capable of trimming the excess molten solder from the base material, the film thickness of the molten solder coated on the base material can be controlled evenly and in increments of a few μm. Therefore, the thin-film plating can be accomplished wherein the film thickness is less than that of the conventional system.

According to the thin solder film plated member and the manufacturing method thereof of the present invention, they can manufacture the thin solder film plated member having the solder layer thickness less than the conventional system. Therefore, the material can be provided for the shield case and the like for electronic circuits of cell phones, game machines, etc.

MODES FOR IMPLEMENTING THE INVENTION

An object of the present invention is to provide a hot-dip plating apparatus for plating a thin molten solder film, a thin solder film plated member and a manufacturing method thereof. This invention is capable of controlling a film thickness of the molten solder coated on a base material evenly and in increments of a few μm as well as achieving thin solder plating with a film thickness less than the conventional system.

Figure 1:
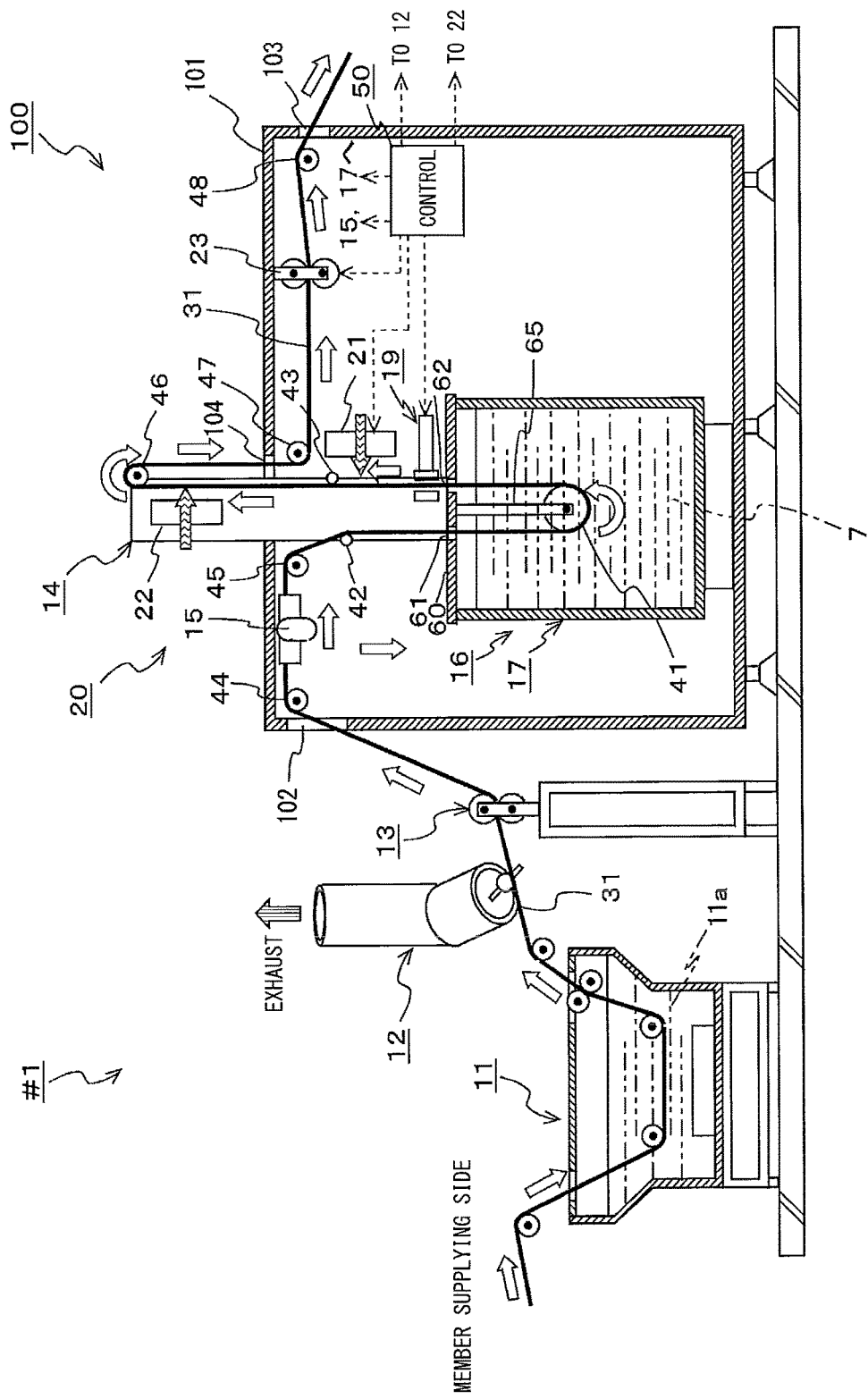
FIG. 1 is a cross sectional view of illustrating a configuration example of a system #1 of manufacturing a thin solder film plated member according to an embodiment of the present invention.

The hot-dip plating apparatus for plating the thin molten solder film, the thin solder film plated member and the manufacturing method thereof according to embodiments of the present invention will be discussed by reference to the drawings. A system #1 for manufacturing a plated member shown in FIG. 1 is a system for manufacturing a thin solder film plated member 10 and comprises a washing tank 11, a dryer section 12, a first conveying section 13 and a hot-dip plating apparatus 100 for plating a thin molten solder film. Assuming that a side of inputting a strip member 31 as an example of a base material is an upstream (member supplying side), a direction of flowing the strip member 31 (traveling direction) is called a downstream.

The strip member 31 is wound around, for example, a winding reel in a roll manner wherein the reel is not shown but acts as a member supply section. The strip member 31 has a predetermined width and consists of a longitudinal copper member, albata, Kovar member or the like. In this example, the longitudinal Kovar member is used as the base material.

In FIG. 1, the washing tank 11 is provided at the downstream side of the member supply section and the washing tank 11 accommodates wash solution 11a. Isopropyl alcohol (IPA) or the like is used as the wash solution 11a. The dryer section 12 is provided at the downstream of the washing tank 11. A blower is used for the dryer section 12. The first conveying section 13 is provided at the downstream of the dryer section 12. A control roller member is used for the first conveying section 13. In the control roller member, for example, a compressing pressure at a nip portion of the upper and lower rollers is set higher with respect to a conventional driven roller.

A driving roller member provided at a second conveying section 23, which will be described hereinafter, conveys the strip member 31 and the control roller member of the first conveying section 13 applies a predetermined tension to the strip member 31 in order to convey the strip member at a predetermined speed. For this purpose, a driving motor may be provided for the control roller of the first conveying section 13. Instead of providing the driving motor, the control roller may be driven by the driving roller for the second conveying section 23. In this example, it is assumed that the control roller member of the first conveying member 13 is driven.

<Configuration Example of Hot-Dip Plating Apparatus 100 for Plating Thin Molten Solder Film>

A hot-dip plating apparatus 100 for plating a thin molten solder film is provided at the downstream side of the first conveying section 13 shown in FIG. 1. The hot-dip plating apparatus 100 for plating the thin molten solder film takes in the washed strip member 31, coats the strip member 31 with the multi-element molten solder 7 (molten solder) heated to a predetermined temperature, controls its film thickness and then ejects the thin solder film plated member 10 while cooling the strip member 31.

The hot-dip plating apparatus 100 for plating the thin molten solder film includes a box type main body section and the main body section 101 includes an opening section 104 at a predetermined position of its top panel. The opening section 104 is a border for dividing the conveying path to the left and right sides. An inlet port 102 is provided at the left side surface (upstream side) and an outlet port 103 is provided at the right side (downstream side).

A longitudinal member 14 is provided for mounting parts along the inside and outside of the main body 101 wherein the inside and outside are divided by the opening section 104. The longitudinal member 14 comprises a driven conveying roller 46, two guide projections 42, 43, a slide member not shown, etc. A conveying roller 46 is provided at a diagonally right upper portion of the longitudinal member 14.

Two driven conveying rollers 44, 45 are mounted at a position of a rear surface side of the main body 101 and a left side of the longitudinal member 14. Two driven conveying rollers 47, 48 are mounted at the right rear side of the main body. The main body 101 comprises, in its inside, a preheating section 15, a chamber 16, a solder bath 17, a blower section 19, a cooling section 20 and a control section 50.

The preheating section 15 is provided at the downstream side of the inlet port 102 and between two conveying rollers 44 and 45. The prehearing section 15 uses an air-heater. The chamber 16 and the solder bath 17 are positioned at the downstream side of the conveying roller 45.

The solder bath 17 accommodates the molten solder 7 of the multi-element solder composition that is one example of the molten solder. The molten solder 7 may be, for example, a five-element solder composition (Pb-0.5Ag-3Bi-2In-4Sn: solder #6064 (manufactured by Senju Metal Industry Co., Ltd.)) consisting of lead (Pb), silver (Ag), bismuth (Bi), indium (In) and tin (Sn). A melting temperature of the molten solder 7 is about 295° C.

The chamber 16 is mounted to cover the upper portion of the solder bath 17 and is filled with inactive gas, such as nitrogen (N2). In this example, a cover section 60 is provided at an upper portion of the chamber 16. There are two openings 61 and 62 at the cover section 60 wherein the opening 61 forms an input section to the solder bath 17 for the strip member 31 and the opening 62 forms an output section from the solder bath 17 for the strip member 31.

A driven conveying roller 41 is provided in the solder bath 17. A bearing member 65 at the front and back portions of the main body 101 supports a shaft of the conveying roller 41. The bearing member 65 is mounted in a unified manner with the cover section 60 and is supported by the longitudinal member 14 slidably in a vertical direction. In other words, the longitudinal member 14, the cover section 60 and the bearing member 65 are able to slide vertically in a unified manner.

The conveying roller 41 is a carbon (C) roller to prevent solder dissolution. The strip member 31 passes through the opening 61, turns around at the conveying roller 41 and reaches the opening 62. An ultrasonic sound wave horn not shown may be mounted at the inner surface of the chamber 16. By using the ultrasonic sound wave hone, the oxide film and dust adhered to the soldered portion of the base material are trimmed by the strong vibration and thereby the solder can be adhered metallically.

The blower section 19 is mounted at an upper portion of the chamber 16. Wide-angle flat opening type air-knives or gas nozzles 91, 92 are used as the blower section 19 for jetting the hot gas (refer to FIG. 2). The hot gas is the inactive gas such as nitrogen.

The cooling section 20 is provided at the upper side of the blower section 19. In this example, the cooling section 20 has a first fan 21 and a second fan 22. The first fan 21 is provided under and adjacent to the longitudinal member 14. The second fan 22 is attached to the upper portion of the longitudinal member 14 exposed to the upper side of the main body 101. The first fan 21 and the second fan 22 are a propeller type or sirocco type cooling air blower.

In this example, the second conveying section 23 is provided between the conveying roller 47 and the conveying roller 48 and is suspended from the top panel portion of the inside of the main body 101. A driving roller member is used for the second conveying section 23. The roller member is ganged with a motor not shown.

The pathway of the strip member 31 passes through the opening section 104, turns around the conveying roller 46, passes through the opening section 104 again and reaches the conveying roller 47. Driven roller members, such as metal rollers, heat-hardiness rubber rollers, resin rollers, etc. are used as the above-described five conveying rollers 44, 45, 46, 47 and 48.

The control section 50 is provided at a predetermined position of the above-described main body 101. The control section 50 is connected to the preheating section 15, the solder bath 17, the blower section 19, the first fan 21, the second fan 22, the second conveying section 23, etc. A controller of the dryer section 12 outside the apparatus and the first conveying section 13 include driving motors. If these motors are necessary to be controlled, the controller 50 is connected to the motors and the like for driving the dryer section 12 and the first conveying section 13. In this example, the first conveying section 13 is the driven motor. It will be described hereinafter that the control section 50 controls them including the dryer section 12 collectively.

Figure 2:
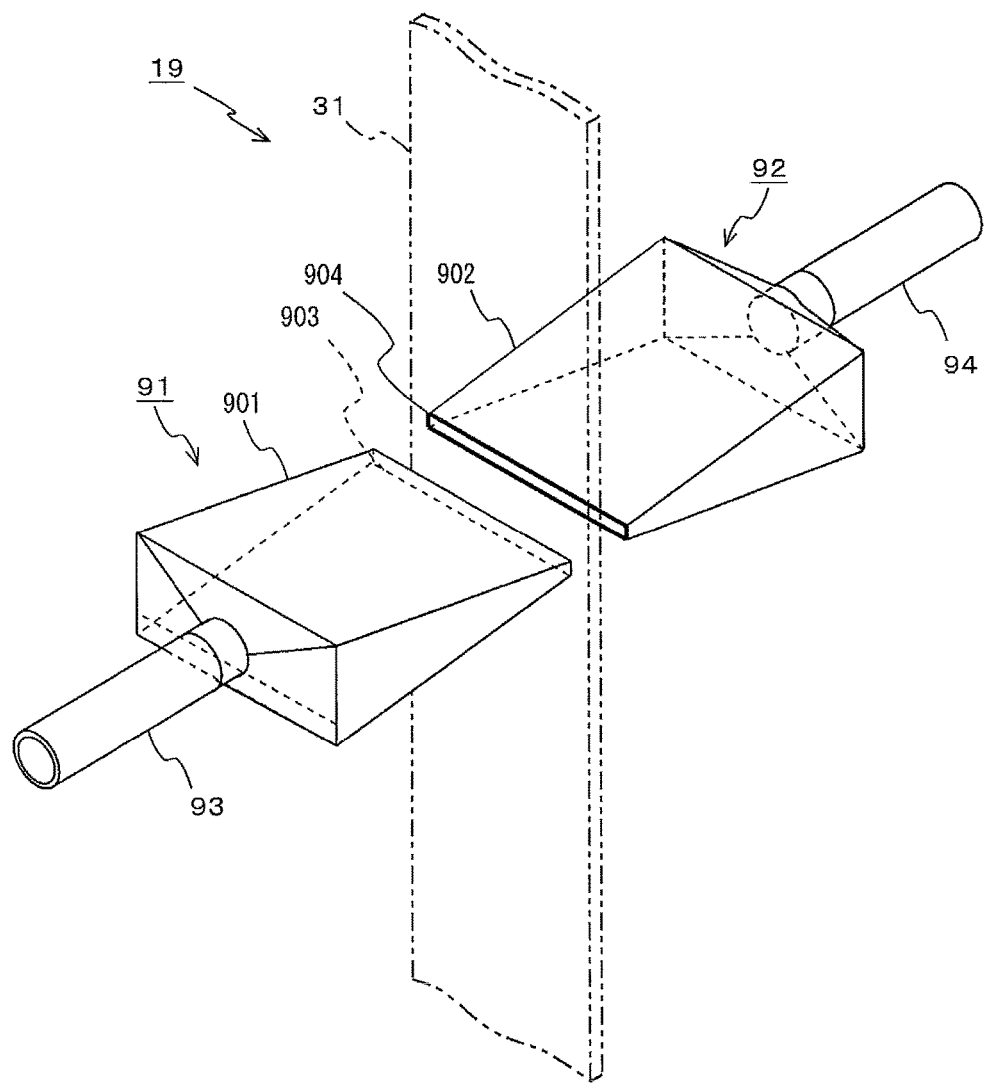
FIG. 2 is a perspective view illustrating an arrangement example of gas nozzles 91, 92 of a blower section 19.

An arrangement example and a function example of the gas nozzles 91, 92 of the blower section 19 will be explained by reference to FIG. 2 and FIG. 3. The blower section 19 shown in FIG. 2 includes a set of gas nozzles 91 and 92. Each of the gas nozzles 91 and 92 has the wide angle flat opening to trim the excess molten solder 7 coated in the solder bath 17 from the strip member 31 with the heated gas blow during the film thickness control (refer to FIG. 3). For example, a stainless flat nozzle (Silvent 971 manufactured by Silvent) is used for the gas nozzles 91, 92.

Figure 4:
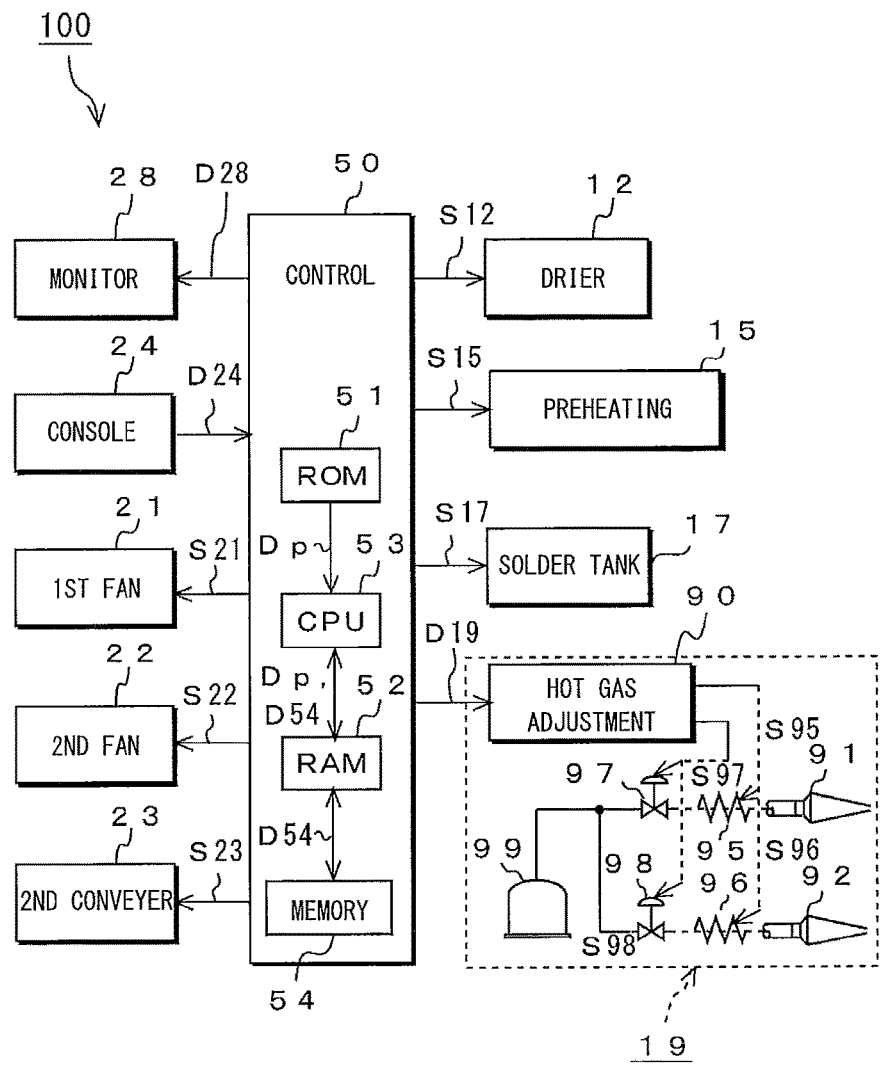
FIG. 4 is a block diagram illustrating a configuration example of a control system for a hot-dip plating apparatus 100 for plating a thin molten solder film.

The gas nozzle 91 has a nozzle main body 901 and a conduit 93. One end of the nozzle body 901 is a wide-angle flat portion 903. An opening width of the wide-angle flat portion 903 is set to be equal to the width of the strip member 31 in this example. The other end of the nozzle main body 901 is connected to the conduit 93 to which N2 gas is applied. A heater 95 shown in FIG. 4 is attached to the conduit 93 to set a temperature of the N2 gas equal to or higher than the melting temperature of the molten solder 7. In this example, since the melting temperature of the solder is 295 degree, the gas is heated to about 300° of the temperature. The conduit 93 is connected to an N2 bomb 99 and the like through a flow control bulb 97 shown in FIG. 4.

The gas nozzle 92 has a nozzle body 902 and a conduit 94. One end of the nozzle body 902 is a wide-angle flat portion 904 similarly to the gas nozzle 91. In this example, the opening width of the wide-angle flat portion 904 is set to be substantially equal to the width of the strip member 31. The other end of the nozzle body 902 is connected to a conduit 94 to which the $N_2$ gas supplied. A heater 96 is similarly mounted at the conduit 94 to heat the $N_2$ gas to a temperature of about 300° C. The conduit 94 is connected to the $N_2$ bomb 99 through a flow control bulb 98. Although the opening widths of the wide-angle flat portion 903, 904 are set to substantially equal to the width of the strip member 31, the opening width can be set on as needed basis.

A blower temperature (edge temperature) of the wide-angle flat portions 903, 904 of the gas nozzles 91, 92 are set to be equal to or higher than the melting temperature of the molten solder. In the above-described example, the temperature is maintained to about 300° C. In this example, the gas nozzle 91 is arranged so that its wide-angle flat portion 903 is parallel with the conveying surface of the strip member 31 and the gas nozzle 92 is arranged so that its wide-angle flat portion 904 is parallel with the conveying surface of the strip member 31. This parallel arrangement is for blowing the hot gas on the conveying surface of the strip member 31 evenly.

Figure 3:
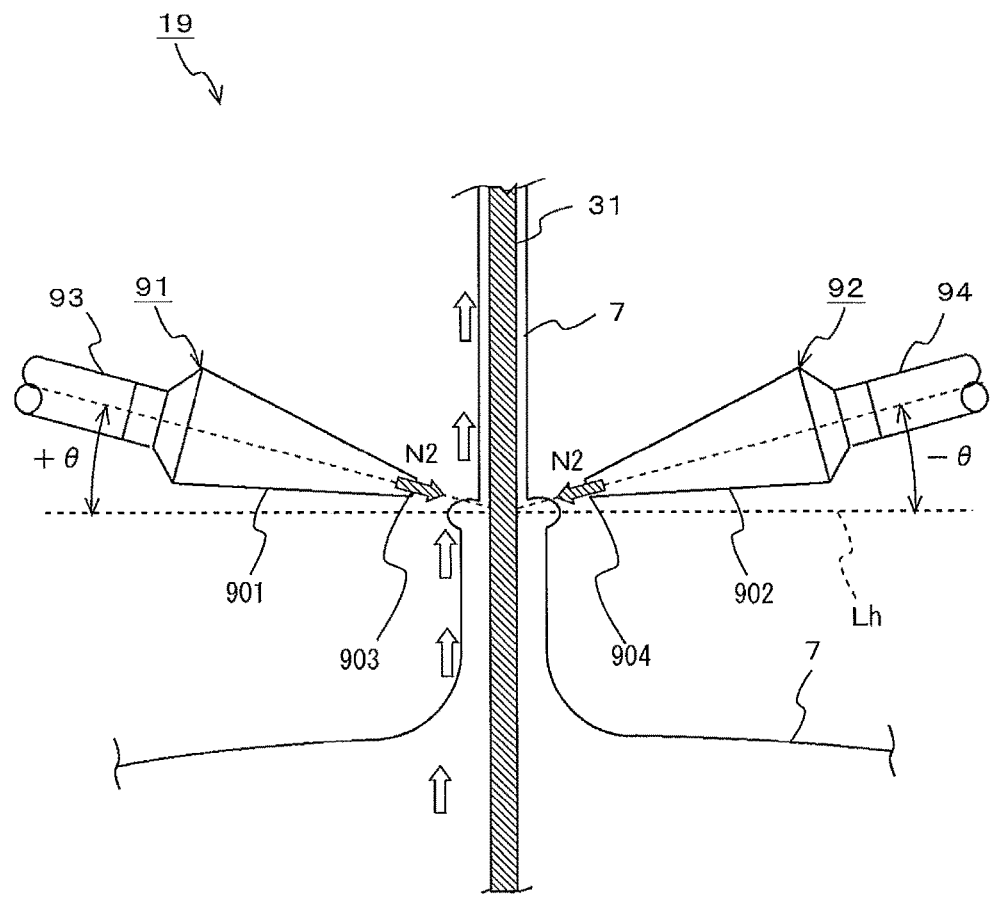
FIG. 3 is a front view illustrating a function example at a time of hot gas blow by the gas nozzles 91, 92.

In FIG. 3, outline arrows show a conveying direction of the strip member 31 that moves at a predetermined conveying speed. In the blower section 19 shown in FIG. 3, the gas nozzle 91 is positioned at the left side of the strip member 31 and is attached to a fixing member not shown in condition of being inclined by an angle +θ (plus reference clockwise) with respect to a horizontal line Lh. The gas nozzle 92 is arranged at the right side of the strip member 31 and is attached to the fixing member not shown in condition of being inversely inclined by an angle −θ (the same reference) with respect to the horizontal line Lh.

The gas nozzle 91 blows the hot gas on the left side surface of the strip member 31 wherein the hot gas is adjusted by the flow volume adjustment bulbs 97, 98 not shown. The gas nozzle 92 blows the hot gas on the right side surface of the strip member 31 wherein the hot gas is adjusted by the flow volume adjustment bulbs 97, 98. Thus, the hot gas blow (both sides' blow of the strip member 31) can trim the excess molten solder from both surfaces of the left and right sides of the strip member 31 immediately after being drawn up wherein the strip member is conveyed at the predetermined conveying speed. Therefore, the control of plating the thin molten solder film can be achieved so as to make the thickness thicker than 2 μm~5 μm level at each surface.

Although the opening widths of the wide-angle flat portions 903, 904 are set to be substantially equal to the width of the strip member 31 in this example as described hereinbefore, they can be set as needed basis. In addition, the gas nozzles 91, 92 are arranged so as to be in parallel with the conveying surface of the strip member 31 in this example. However, they may be arranged with a predetermined angle with respect to the strip member 31 and the blowing angle (θ) of the hot gas to the strip member 31 may be changed if needed.

Figures 5, 6:
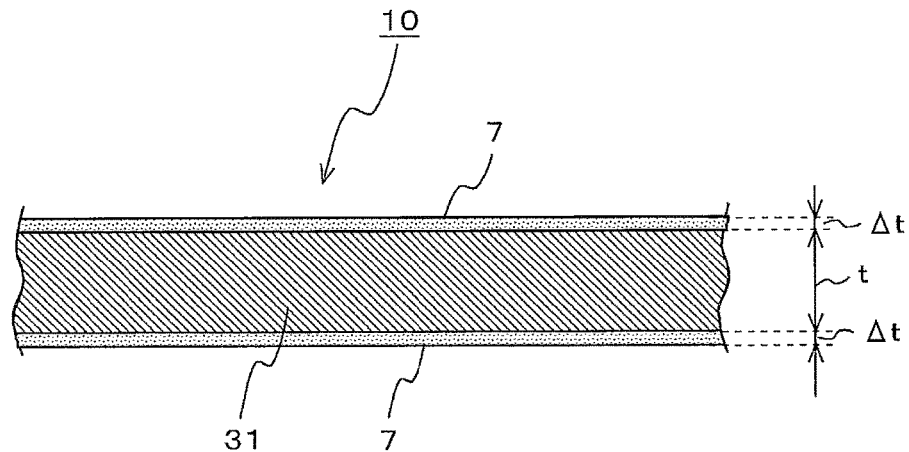
FIG. 5 is a table illustrating an example of temperature values and flow volumes at a time blowing the hot gas corresponding to the composition of the multi-element solder composition.
FIG. 6 is a cross sectional view illustrating a configuration example of a thin solder film plated member 10.

Next, a configuration example of a control system for the hot-dip plating apparatus 100 for plating the thin molten solder film will be discussed by reference to FIG. 4 and FIG. 5. In the hot-dip plating apparatus 100 for plating the thin molten solder film shown in FIG. 4, the control section 50 is connected to the preheating section 15, the solder bath 17, the blower section 19, the first fan 21, the second fan 22, the second conveying section 23, etc. as well as the dryer section 12, a console 24 and a monitor 28.

In order to control whole the system, the control section 50 comprises a ROM 51 (Read Only Memory), a RAM 52 (Random Access Memory), a central processing unit (hereinafter referred to as "CPU 53") and a memory section 54. The ROM 51 stores, for example, a system program Dp for controlling the whole of the system #1 for manufacturing the thin solder film plated member.

The control section 50 reads the system program Dp stored in the ROM 51 in response to an initiate operation of the console 24, expands it in the RAM 52 and initiates the thin-film solder coated member manufacturing system #1 in accordance with the expanded system program Dp. The DFC-100L type controller manufactured by Inflidge Industrial Ltd. is used for the controller 50.

The console 24 includes a key input section, such as ten keys, a touch panel, etc. not shown. The console 24 operates to set the thin-film controlling condition and the like corresponding to the multi-element solder composition during the film thickness control of the thin solder film plated member 10. The film thickness controlling condition of the thin solder film plated member 10 includes the melting temperature of the molten solder 7, the flow volume and temperature of the hot gas and the like.

For example, such operation is to set the preliminary heating temperature of the strip member 31 corresponding to #6064 solder of the five-element composition, the melting temperature of the molten solder 7, the flow volume of the $N_2$ gas, the temperature of the hot gas and the like. The film thickness controlling condition set by the console 24 is output as the operation data D24 to the control section 50. In this example, the operation data D24 representative of the film thickness controlling condition corresponding to the multi-element solder composition set by the console 24 is stored in the RAM 52, etc. through the CPU 53.

The monitor 28 comprises a liquid crystal display device (LCD) and the film thickness controlling condition corresponding to the multi-element solder composition is displayed in accordance with a display data D28. The display data D28 is a data for displaying the flow volume of the N2 gas corresponding to the multi-element solder composition and the temperature of the hot gas at the film thickness controlling time. This data is output from the control section 50 to the monitor 28. The above-described memory section 54 stores the control data D54 corresponding to the molten solder 7 of the multi-element solder composition necessary for the film thickness control of the thin solder film plated member 10. As shown in a table of FIG. 5, the memory section 54 has columns relating to a target film thickness Δt [μm] of the molten solder 7 toward the strip member 31, a flow volume Q [NL/min] of the hot gas, for example, N2 gas at the blower section 19, a temperature T [° C.] of the hot gas, etc.

A flow volume Q1 of the N2 gas and a temperature T1 of the hot gas are written for the target film thickness Δt=1.5~2.0 [μm]. A flow volume Q2 of the N2 gas and a temperature T2 of the hot gas are written for the target film thickness Δt=1.0~1.5 [μm]. A flow volume Q3 of the N2 gas and a temperature T3 of the hot gas are written for the target film thickness Δt=0.5~1.0 [μm]. A flow volume Q4 of the N2 gas and a temperature T4 of the hot gas are written for the target film thickness Δt=0.0~0.5 [μm]. The flow volume Q1, the hot gas temperature T1 and the like written in the memory 54 are empirical values verified by experimental trial.

For example, in a case that the strip member 31 is a copper member, its conveying speed is 3 m/min, and the molten solder 7 of the multi-element solder composition is the solder #6064 of the five-element solder composition (Pb-0.5Ag-3Bi-2In-4Sn). In addition, its melting temperature is 295° C. and the flow volume Q1=60 NL/min for the N2 gas and the temperature T1=300° C. are written for the target film thickness Δt=1.5~2.0 [μm]

In this example, the flow volume Q [NL/min] of the N2 gas, the hot gas temperature T [° C.] corresponding to the target film thickness Δt [μm] and the like can be read out as the control data D54 from the memory section 54. The target film-thickness Δt [μm] of the molten solder 7 is set to the control section 50 through the console section 24. The control section 50 sets the blower section 19 with the hot gas temperature T and the N2 flow volume Q corresponding to the composition of the molten solder 7 so that the molten solder 7 is trimmed from the strip member 31 in order to control the film thickness of the molten solder 7 toward the strip member 31.

If the internal memory capacity in the control section 50 is insufficient, then an external memory device may be connected, the N2 gas flow volume, the hot gas temperature, etc. corresponding to the target film thickness Δt may be measured and the data during the measurement may be stored. A data logger model GR-3500 manufactured by Keyence Corporation may be used as the external memory device.

The control section executes the film thickness control in accordance with a feed forward control based on the operation data D24. For example, by using the target film thickness Δt [μm] of the molten solder 7 for the strip member 31 as an address, the control data D54 representative of the hot gas temperature T and the flow volume Q corresponding to the composition of the molten solder 7 is read out from the memory section 54. The control section 50 writes a material name of the molten solder 7, for example, the five-element molten solder 7 (#6064 solder) as header information. Then, the control section 50 sets a blower control data D19 to a hot gas adjustment section 90. The blower control data D19 is a data stream type where the control data D54 is added to the header information.

For example, if the coated volume (film thickness volume) of the molten solder 7 toward the strip member 31 can be sensed in real time by using a non-contact type measurement instrument, then the film thickness control may be executed in accordance with the feedback control based on the sensed coating volume of the molten solder 7 on the strip member 31. According to the feedback control, when the film thickness of the molten solder 7 toward the strip member 31 is large, both the hot gas temperature T and the N2 flow volume Q are set to be high for increasing the volume of the molten solder 7 trimmed from the strip member 31. However, when the film thickness of the molten solder 7 toward the strip member 31 is small, both the hot gas temperature T and the N2 flow volume Q are set to be low for decreasing the volume of the molten solder 7 trimmed from the strip member 31.

The above-described control section 50 controls the display on the monitor 28 in accordance with the display data D28 and receives the operation data D24 from the console 24. Therefore, the control section 50 can control the input/output of the dryer section 12, the preheating section 15, the solder bath 17, the first fan 21, the second fan 22, the second conveying section 23, the hot gas adjustment section 90, etc.

The dryer section 12 receives a blower control signal S12 from the control section 50 and dries by blowing the air on the washed strip member 31 in accordance with the blower control signal S12. The blower control signal S12 is a signal for driving the blower not shown but attached to the dryer section 12 and is applied from the control section 50 to the dryer section 12.

The second conveying section 23 receives a roller drive signal S23 from the control section 50 when conveying the strip member. Then, the second conveying section 23 sends the strip member 31 to the hot-dip plating apparatus for plating the thin molten solder film while keeping a predetermined tension to the strip member 31 in cooperation with the first conveying section 13 that is driven in response to the roller drive signal S23. The roller drive signal is a signal of driving a motor for rotating a driven roller not shown and is applied to the second conveying section 23 from the control section 50.

The preheating section 15 receives a heater drive signal S15 from the control section and heats up the washed strip member 31 by blowing the hot air in response to the heater drive signal S15. The heater drive signal S15 is a signal for driving an air heater not shown but attached to the preheating section 15 and is applied from the control section 50 to the preheating section 15.

The solder bath 17 receives a solder bath control signal S17 from the control section 50 and heats up the multi-element composition solder (#6064 or the like) in response to the solder bath control signal S17 to make the molten solder 7 having the melting temperature of about 273~295° C. The solder bath control signal S17 is a signal for driving a heater not shown but attached to the solder bath 17 and is applied from the control section 50 to the solder bath 17.

The blower section 19 comprises the gas nozzles 91, 92 as well as the hot gas adjustment section 90, the heaters 95, 96, the flow-volume adjustment bulbs 97, 98 and N2 bomb 99. The flow-volume adjustment bulbs 97, 98 are connected to the N2 bomb 99 to supply the N2 gas to the gas nozzles 91, 92. In this example, in order to make the edge temperature of the gas nozzles 91, 92 be 300° C. if the melting temperature of the molten solder is 273~295° C., the temperature of the nozzle bodies of the gas nozzles 91, 92 and the heating temperature of the heaters 95, 96 are determined.

The hot gas adjustment section 90 receives a blower control data D19 from the control section 50 during the film thickness control and blows the hot gas on the strip member 31 in response to the blower control data D19 immediately after being pulled up from the solder bath 17. The blower control data D19 includes a data for driving a motor not shown but rotating the flow volume bulbs 97, 98, a data for driving the heaters 95, 96 for heating up the N2 gas, and the like. The blower control data D19 is applied from the control section 50 to the hot gas adjustment section 90. The hot gas adjustment section 90 decodes the blower control data D19 to generate the heater drive signals S95, S96 and the bulb adjustment signals S97, S98.

The heater 95 receives the heater drive signal S95 from the hot gas adjustment section 90 and heats up the N2 gas through the conduit 93 (refer to FIGS. 2 and 3) to reach the target temperature (300° C.) based on the heater drive signal S95. The heater 96 receives the heater drive signal S96 from the hot gas adjustment section 90 and heats up the N2 gas through the conduit 94 (refer to FIGS. 2 and 3) to reach the target temperature based on the heater drive signal S96.

The flow-volume adjustment bulb 97 receives a bulb adjustment signal S97 from the hot gas adjustment section 90 and adjusts the flow volume Q of the N2 gas to reach the target value based on the bulb adjustment signal S97. The flow-volume adjustment bulb 98 receives a bulb adjustment signal S98 from the hot gas adjustment section 90 and adjusts the flow volume Q of the N2 gas to reach the target value based on the bulb adjustment signal S98.

The first fan 21 receives a fan control signal S21 from the control section 50 during conveying the strip member. Then, the first fan 21 blows the air of the inside (inside temperature) of the main body 101 on one side of the strip member 31 to cool down the strip member 31 in accordance with the fan control signal S21 after adjusting the film thickness. The fan control signal S21 is a signal for driving a motor not shown but mounted at the first fan 21 and is applied from the control section 50 to the first fan 21.

The second fan 22 receives a fan control signal S22 from the control section 50 during conveying the strip member. Then, the second fan 22 blows the air of the upper portion (ambient temperature) of the main body 101 on the other one side of the strip member 31 to cool down the strip member 31 in accordance with the fan control signal S22 after adjusting the film thickness. The fan control signal S22 is a signal for driving a motor not shown but mounted at the second fan 22 and is applied from the control section 50 to the second fan 22. They configure the control system of the hot-dip plating apparatus 100 for plating the thin molten solder film.

<Configuration Example of Thin Solder Film Plated Member 10>

Then, a configuration example of the thin solder film plated member 10 will be explained by reference to FIG. 6. The thin solder film plated member 10 shown in FIG. 6 comprises the strip member 31 having a predetermined thickness t and solder layers 7 having the film thickness Δt and coating the front and rear of the strip member 31.

The solder layer 7' is formed by controlling the film thickness of the molten solder 7 in the hot-dip plating system #1 for manufacturing the thin solder film plated member. The solder layers 7' remain on the front and rear of the strip member 31 by the following steps. A first step is to accommodate the molten solder 7 heated to the predetermined temperature (295° C.). The next step is to dip the strip member 31 in the solder bath 17 that accommodates the molten solder 7. The next step is to pull up the strip member 31 dipped in the solder bath 17 from solder bath 17. Then, a step is to blow the hot gas on the strip member 31 immediately after being pulled up for trimming the molten solder 7 from the strip member 31. The hot gas has the predetermined flow volume Q NL/min and the temperature T ° C. higher than the melting temperature corresponding to the composition of the molten solder 7.

<Method of Manufacturing Thin Solder Film Plated Member 10>

Forming examples (first through sixth) of the thin solder film plated member 10 shown in FIG. 6 will be explained by reference to FIGS. 7A-7C, FIG. 8A, FIG. 8B and FIG. 9. In the examples, an assumption is that the thin solder film plated member 10 is manufactured by coating the strip member 31 with the five-element composition molten solder 7 (#6064 solder) and controlling the film thickness, cooling down the strip member 31. The molten solder 7 is heated to about 273~295° C. by use of the system #1 for manufacturing the thin solder film plated member shown FIG. 1~FIG. 5, In FIG. 7A, the strip member 31 is prepared for the base material of the thin solder film plated member 10. A roll is prepared for the strip member 31 wherein the longitudinal Kovar (KOV-H: Fe—Ni—Co) member is wound around this roll. Since a thermal expansion coefficient of the Kobar member is low in metals and is close to about common temperature and that of a hard glass, it is better to seal the hard glass and to be applied to an IC lead frame.

After preparing the strip member 31, the strip member 31 is set to the system #1 for manufacturing the thin solder film plated member. In this example, the strip member 31 is sent to the washing tank 11 from a member supplying section not shown in hand working, and the strip member 31 is set to a washable condition in FIG. 7B. After that, the edge portion of the strip member 31 is led to the inside of the hot-dip plating apparatus 100 for plating the thin molten solder film through the dryer section 12 and the first conveying section 13.

In this example, the strip member 31 is taken out from the solder bath 17 in a vertical (perpendicular) direction toward the gas nozzles 91, 92. The strip member 31 is led to the inside of the main body 101 from the inlet port 102 in hand working. This strip member 31 is set to be released from the outlet port 103 through the conveying roller 44, the preheating section 15, the conveying roller 45, the projection 42, the conveying roller 41 in the solder bath 17, the projection 43 of the longitudinal member 14, the conveying roller 46, the conveying roller 47 in the inside of the main body 101, the second conveying roller 23 and the conveying roller 48.

At this time, the bearing member 65 of the conveying roller 41 and the cover section 60 at the upper portion of the chamber 16 are pulled up in a manner that the bearing member 65 is accommodated in the longitudinal member 14 (along a slide member). Therefore, the conveying roller 41 is exposed to the upper portion from the inner portion of the solder bath 17. Then, the edge portion of the strip member 31 is passed through the opening 61 of the cover section 60 (outward) and the edge portion of the strip member 31 is wound around the conveying roller 41. After that, the edge portion of the strip member 31 (outward) is passed through the opening 62.

Then, the bearing member 65 is slid down from the longitudinal member 14 and the strip member 31 is dipped in the solder bath under a condition that the strip member 31 is wound around the conveying roller 41. Therefore, the strip member 31 wound around the conveying roller 41 is taken out in the vertical (perpendicular) direction. Although the automatic preprocessing is completed in the system #1 for manufacturing the thin solder film plated member, a first few meters of the strip member 31 is released without the solder layer as it is.

An operator sets data for the automatic operation by controlling the console 24. For example, the blower control data D19 from the control section 50 is set to the hot gas adjustment section 90. The blower control data D19 is the data of the hot gas temperature T1=300° C. corresponding to the molten solder 7 of the five-element solder composition (#6064 solder) and the flow volume Q1=60 NL/min that is set to the blower section 19.

The roller drive signal S23 is set to the second conveying section 23 to convey the strip member 31 at the conveying speed=3 m/min. The solder bath control signal S17 is set to the solder bath 17 for melting the solder at the melting temperature=295° C.

Figure 7A:
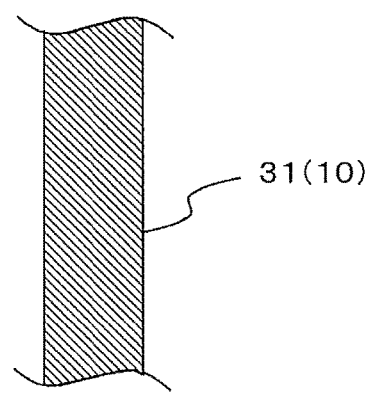
FIG. 7A is a process drawing illustrating a forming example (first) of the thin solder film plated member 10.
Figure 7B:
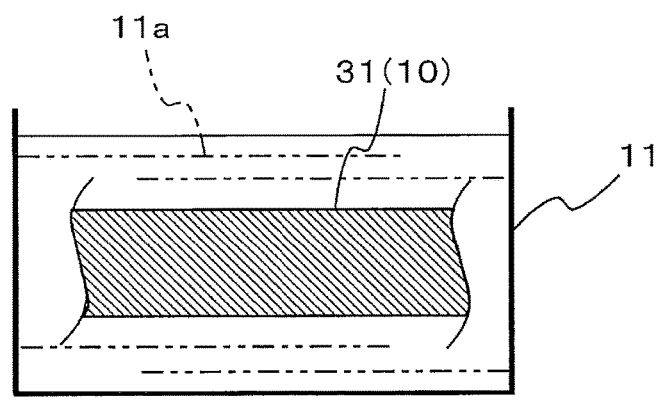
FIG. 7B is a process drawing illustrating a forming example (second) of the thin solder film plated member 10.
Figure 7C:
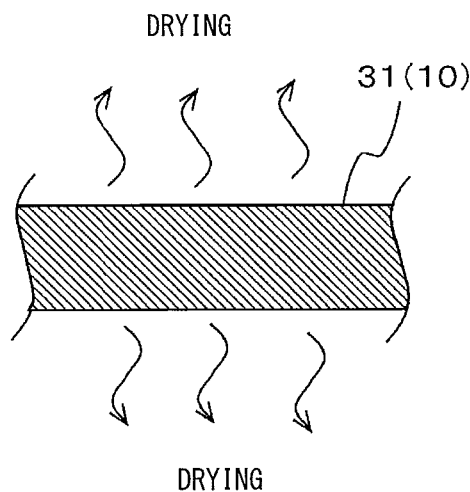
FIG. 7C is a process drawing illustrating a forming example (third) of the thin solder film plated member 10.

When the system #1 for manufacturing the thin solder film plated member is started by operating the console 24, the front, rear and side surfaces of the strip member 31 are washed with the wash solution 11a in the washing tank 11 shown in FIG. 7B. Then, the washed strip member 31 is dried in 7C. At this time, the dryer section 12 receives the blower control signal S12, takes in air in a factory, blows out the wash solution remained at the front, rear and side surfaces of the washed strip member 31, etc. and exhausts in response to the blower control signal S12.

The first conveying section 13 receives the roller control signal S13. When the dried strip member 31 is conveyed into the hot-dip plating apparatus 100 for plating the thin molten solder film, its conveying load is increased in order to apply a tension (tensile force) in response to the roller control signal S13. The second conveying section 23 moves (conveys) the strip member 31 at the predetermined conveying speed by pulling the strip member 31 to which the tension is applied by the first conveying section 13. The second conveying section 23 conveys the strip member 31 at the conveying speed=about 3 [m/min] in accordance with the roller drive signal S23.

Figure 8A:
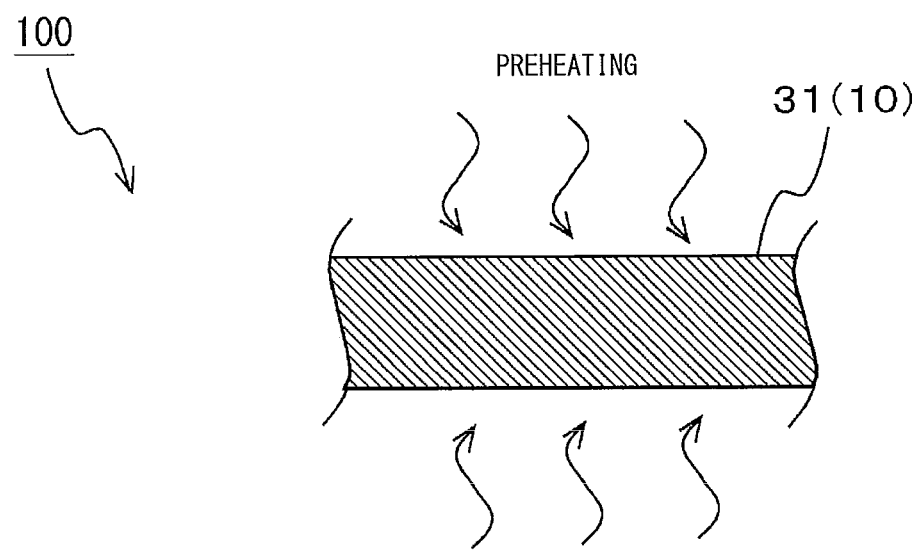
FIG. 8A is a process drawing illustrating a forming example (fourth) of the thin solder film plated member 10.

Then, the dried strip member 31 is preheated in FIG. 8A. At this time, the preheating section 15 receives the heater drive signal S15 and applies the heated (hot) air to the strip member 31 conveyed into the main body 101 on the basis of the heater drive signal S15 to remove the residual alcohol component and increase the temperature of the strip member 31 (preheat).

Figure 8B:
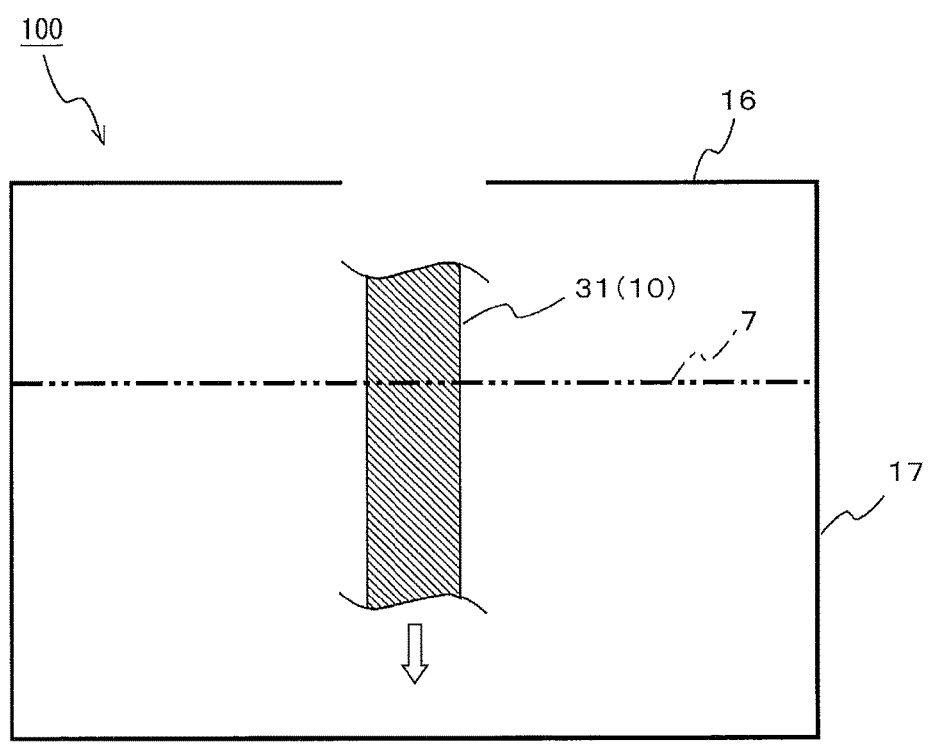
FIG. 8B is a process drawing illustrating a forming example (fifth) of the thin solder film plated member 10.

In FIG. 8B, the preheated strip member 31 is dipped in the solder bath 17 that accommodates the molten solder 17. Of course, the chamber 16 has fill with the N2 gas and the inside of the chamber 16 is the N2 gas atmosphere. The solder bath 17 receives the solder bath control signal S17 and keeps the melting temperature of the molten solder 7 in the solder bath 17 at 295° C. in accordance with the solder bath control signal S17. The conveying direction of the strip member 31 is turned over counterclockwise from the downward direction to the upward direction at the conveying roller 41 in the solder bath 17.

In the N2 gas atmosphere in the chamber 16 above the solder bath 17, the second conveying section 23 is continuously driven in accordance with the roller drive signal S23 so that the strip member 31 is pulled up from the solder bath 17. At this time, the first conveying section 13 puts a brake in the conveying direction of the strip member 31 between the first conveying section 13 and the second conveying section 23 and the second conveying section 23 pulls the strip member 31 to make a condition where the tension is applied to the strip member 31.

Figure 9:
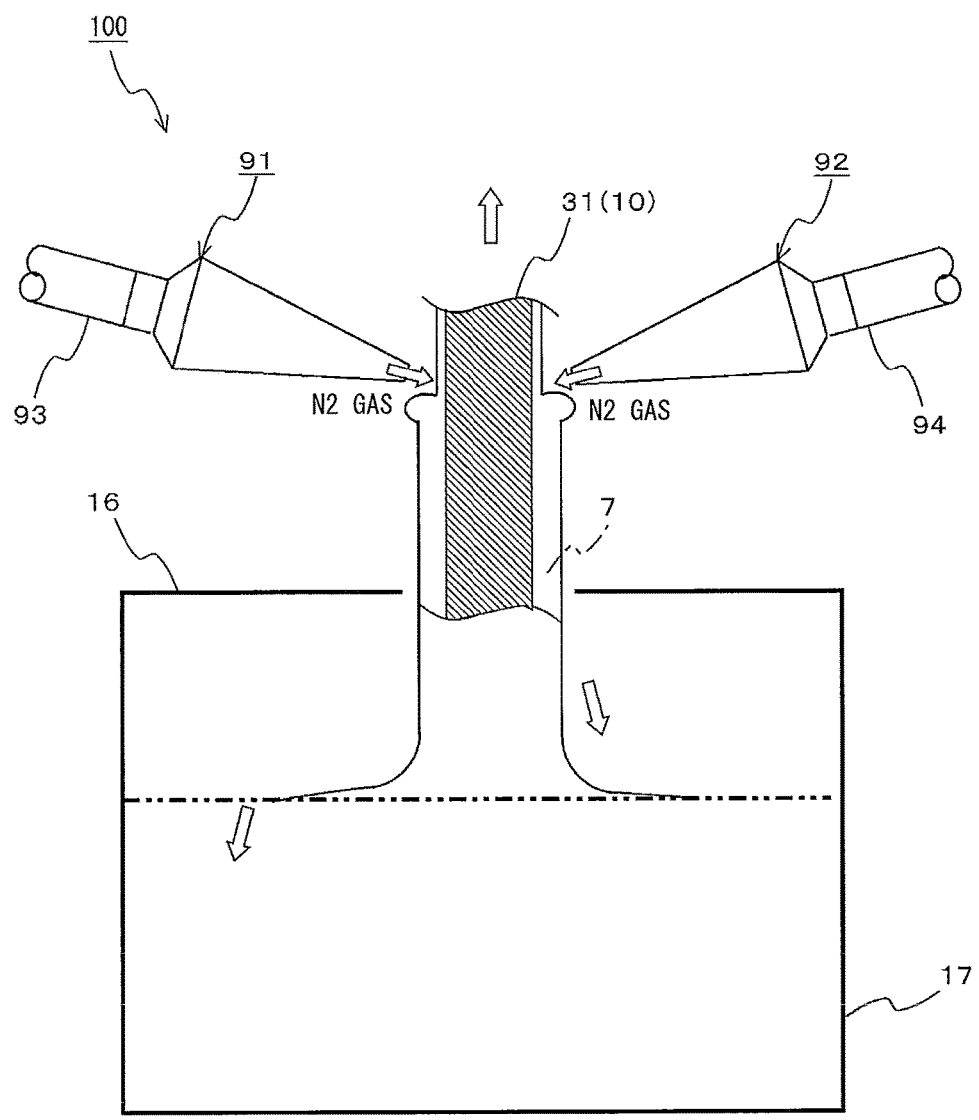
FIG. 9 is a process drawing illustrating a forming example (sixth) of the thin solder film plated member 10.

In FIG. 9, by blowing the hot gas on the strip member 31 immediately after being pulled up to trim the molten solder 7 from the strip member 31 for controlling the film thickness of the molten solder 7 on the thin solder film plated member 10. The hot gas has the temperature T equal to or higher than the melting temperature corresponding to the composition of the molten solder 7 and has the predetermined flow volume Q. According to this film thickness control, the control section 50 supplies the blower control data D19 to the hot gas adjustment section 90. Therefore, it sets the temperature T1=300° C. of the hot gas corresponding to the composition of the molten solder 7 and the flow volume Q1=60 NL/min for controlling the gas nozzles 91, 92 to trim the molten solder 7 from the strip member 31.

The gas nozzles 91, 92 blow the hot gas on the strip member 31 immediately after being pulled up from the solder bath 17. The hot gas has the temperature T1=300° C. equal to or higher than the melting temperature corresponding to the composition of the five-element molten solder 7 (#6064 solder) and has the predetermined flow volume Q1=60 NL/min. Thus, the film thickness of the molten solder 7 on the strip member 31 is controlled and the strip member 31 is coated with the solder layer 7' having the film thickness of a few μm. The strip member 31 coated with the solder layer 7' having the film thickness of a few μm becomes the thin solder film plated member 10.

Then, one side (single surface) of the thin solder film plated member 10 (strip member 31) is cooled down. At this time, the first fan 21 blows the air in the main body 101 on the strip member 31 coated with the solder layer 7' to cool down it in accordance with the fan control signal S21. Then, after cooling down the single side, the other side (both surfaces) of the thin solder film plated member 10 is cooled down. At this time, the thin solder film plated member 10 is temporally put on the upper portion of the main body 101, and the second fan 22 blows the air in the upper portion of the main body 101 on the thin solder film plated member 10 to cool down it immediately after cooling down the single side.

At this time, the conveying roller 46 is turned around clockwise from the upward direction to the downward direction along the conveying direction of the thin solder film plated member 10. By this turning conveyance, the thin solder film plated member 10 is taken in the inside of the main body 10 immediately after cooling down the both surfaces. In the main body 101, the thin solder film plated member 10 is passed through the conveying roller 47, the second conveying roller 23 and the conveying roller 48 to be released from the port 103. The released thin solder film plated member 10 is wound around, for example, the empty reel or the like. Therefore, the longitudinal thin solder film plated member 10 shown in FIG. 6 can be completed.

Following that, coated condition examples of the solder layer 7' of the five-element solder composition (#6064 solder) will be explained by comparing images of the surfaces, cross-sectional views and the like of the thin solder film plated members 10, 30 with and without the hot gas blow by reference to FIG. 10A~FIG. 10F and FIG. 11A~FIG. 11D. The following explained FIG. 12A~FIG. 12I, FIG. 13A, FIG. 14A~FIG. 14I, FIG. 15A as well as 10A~FIG. 10F and FIG. 11A~FIG. 11D are monochrome line drawings with tracing photographs and the actual photographs are prepared to be provided. Condition examples of the surfaces of the thin solder film plated members 10, 30 will be explained with and without the hot gas blow by reference to FIG. 10A~FIG. 10F. The thin solder film plated members 10, 30 are derived by suing the system #1 for manufacturing the thin solder film plated member according to the present invention.

Figure 10A:
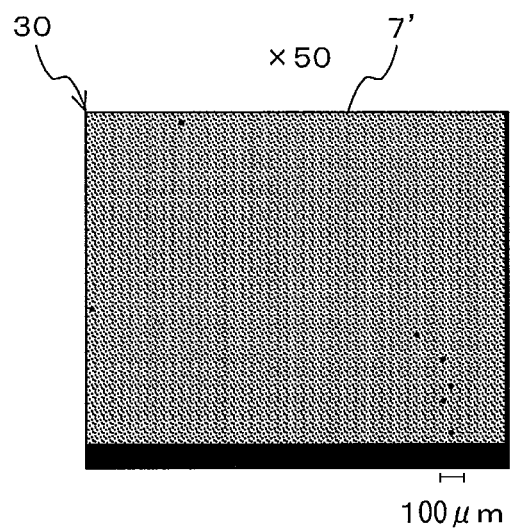
FIG. 10A is a photographic drawing illustrating a surface observation example (×50) of a thin solder film plated member 30 (30 μm thickness) without hot gas blow.
Figure 10B:
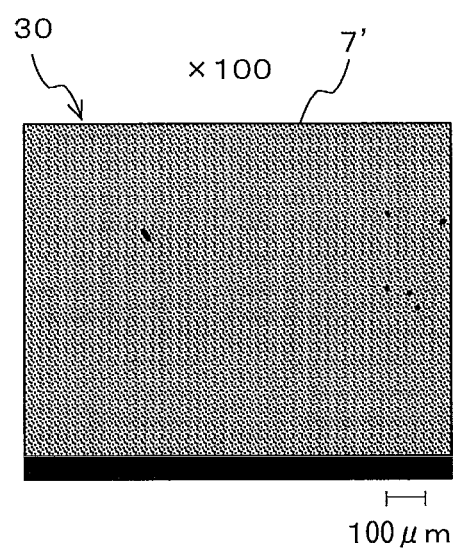
FIG. 10B is a photographic drawing illustrating a surface observation example (×100) of the thin solder film plated member 30 (30 μm thickness) without the hot gas blow.
Figure 10C:
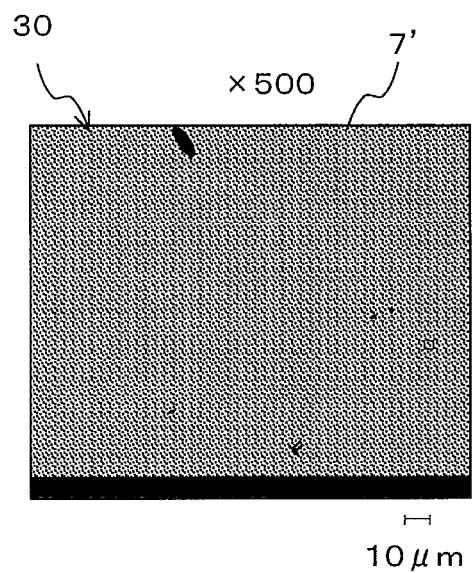
FIG. 10C is a photographic drawing illustrating a surface observation example (×500) of the thin solder film plated member 30 (30 μm thickness) without the hot gas blow.

According to the line drawings of the photographs (hereinafter refer to merely as "photographic drawings") shown in FIG. 10A~FIG. 10C, the surface images of the thin solder film plated member 30 having the solder layer 7' of the film thickness 30 μm is obtained without the hot gas blow. A surface analyzer instrument (SEM) is used for observance. There are three kinds of magnification ratios of 50 times (hereinafter written as ×50), 100 times (×100) and 500 times (×500) in the surface images of the thin solder film plated member 30.

Figure 10D:
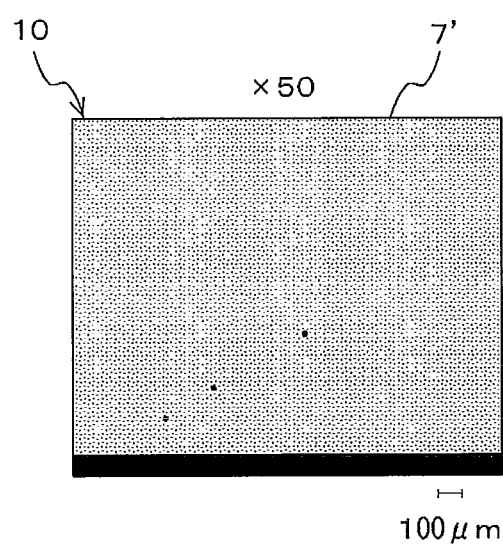
FIG. 10D is a photographic drawing illustrating a surface observation example (×50) of the thin solder film plated member 10 (equal to or less than 2 μm thickness) with the hot gas blow.
Figure 10E:
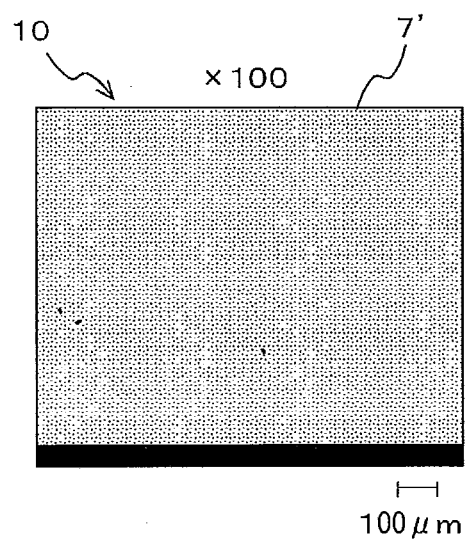
FIG. 10E is a photographic drawing illustrating a surface observation example (×100) of the thin solder film plated member 10 (equal to or less than 2 μm thickness) with the hot gas blow.
Figure 10F:
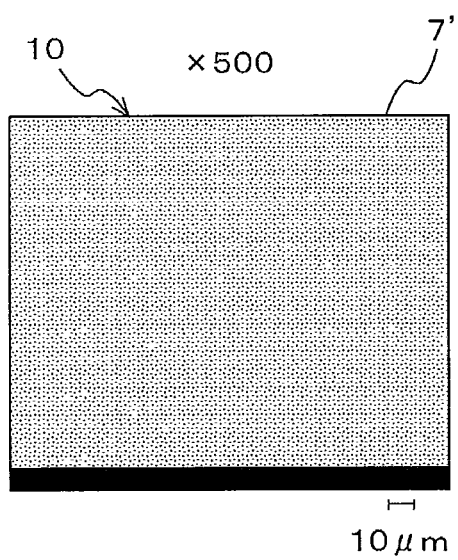
FIG. 10F is a photographic drawing illustrating a surface observation example (×500) of the thin solder film plated member 10 (equal to or less than 2 μm thickness) with the hot gas blow.

According to the photographic drawings shown in FIG. 10D~FIG. 10F, these are cases with the hot gas blow and the surface images are derived by using the above surface analyzer instrument to observe the thin solder film plated member 10 having the solder layer 7' of the film thickness equal to or less than 2 μm. There are three kinds of magnification ratios of 50 times (×50), 100 times (×100) and 500 times (×500) in the surface images of the thin solder film plated member 10.

Making a comparison between the thin solder film plated member 30 (30 μm thickness) without the hot gas blow and the thin solder film plated member 10 (thickness equal to or less than 2 μm) with the hot gas blow, there is no difference between the surface images of the magnification ratios 50 and 100. However, it is verified that the surface condition of the thin solder film plated member 10 with the hot gas blower has less asperity and is smooth as became clear in the surface image of the magnification ratio of 500 times.

Cross-sectional condition examples of the thin solder film plated members 10, 30 with and without the hot gas blow will be described by reference to FIG. 11A~FIG. 11D. According to photographic drawings shown in FIG. 11A and FIG. 11B, the cross-sectional view images of the thin solder film plated member 30 without the hot gas blow are obtained. The observation thereof is done by using a cross-sectional image pickup function of above-described surface analyzer instrument. There are two kinds of the magnified cross-sectional images of the thin solder film plated member 30 in the magnification ratios of 900 times (×900) and 3000 times (×3000). The solder layer 7' of the film thickness 30 μm is verified in the cross-sectional image of the magnification ratio of 900 times.

Figure 11A:
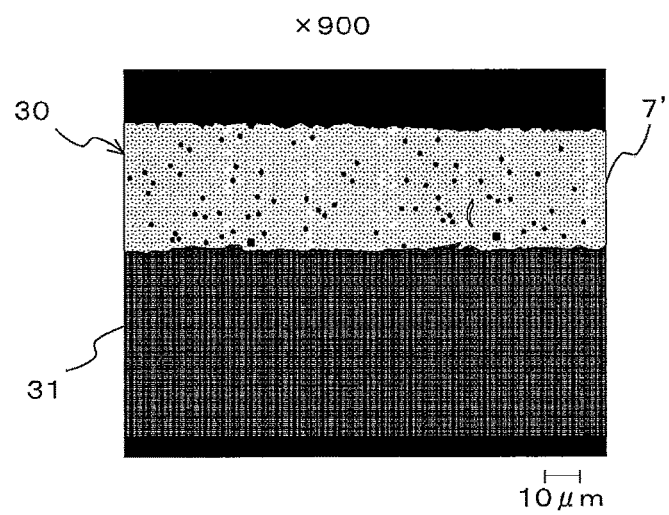
FIG. 11A is a photographic drawing illustrating a cross sectional observation example (×900) of the thin solder film plated member 30 (30 μm thickness) without hot gas blow.
Figure 11B:
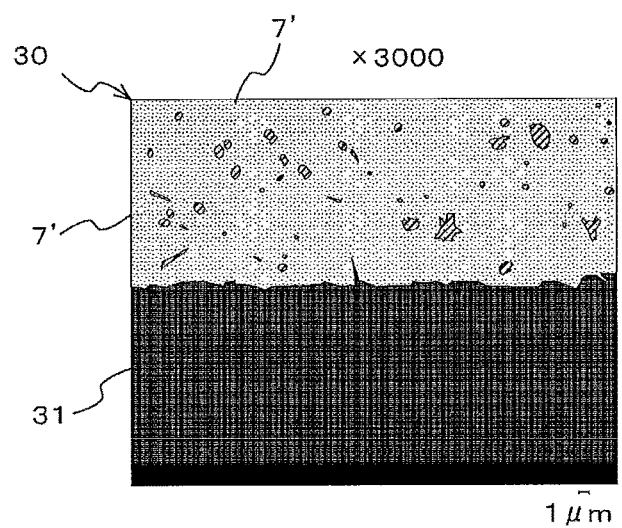
FIG. 11B is a photographic drawing illustrating a cross sectional observation example (×3000) of the thin solder film plated member 30 (30 μm thickness) without the hot gas blow.
Figure 11C:
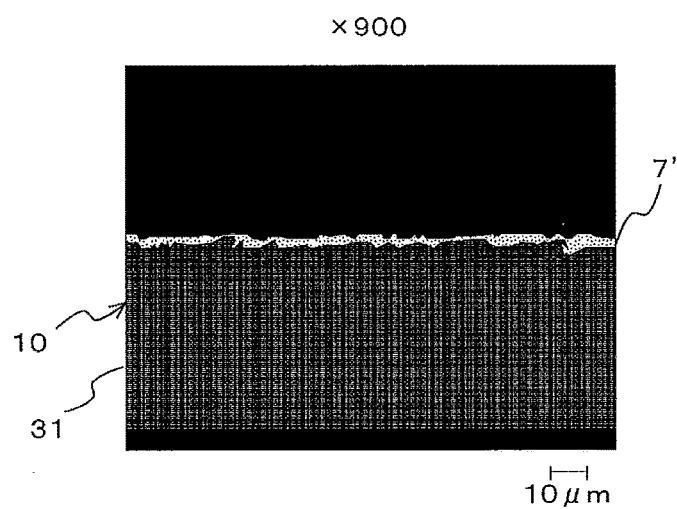
FIG. 11C is a photographic drawing illustrating a cross sectional observation example (×900) of the thin solder film plated member 10 (equal to or less than 2 μm thickness) with the hot gas blow.
Figure 11D:
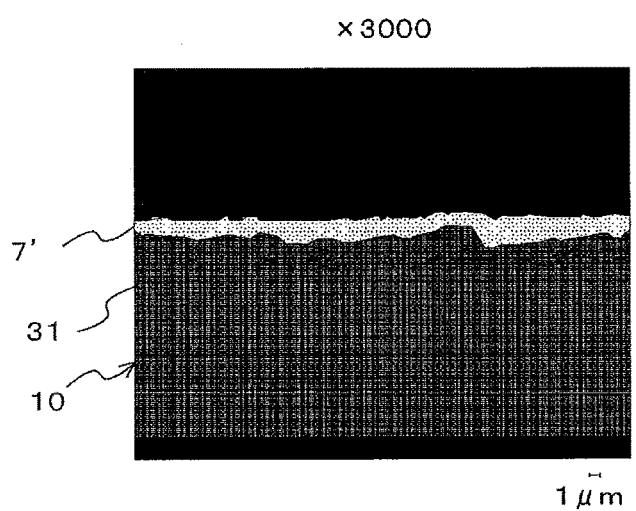
FIG. 11D is a photographic drawing illustrating a cross sectional observation example (×3000) of the thin solder film plated member 10 (equal to or less than 2 μm thickness) with the hot gas blow.

According to the photographic drawings shown in FIG. 11C and FIG. 11D, the thin solder film plated member 10 with the hot gas blow is observed by using the above-described surface analyzer instrument to get the cross-sectional images. There are two kinds of the magnified cross-sectional images of the thin solder film plated member 10 in the magnification ratios of 900 times (×900) and 3000 times (×3000). The solder layer 7' of the film thickness equal to or less than 2 μm is verified in the cross-sectional image of the magnification ratio of 900 times shown in FIG. 11C.

A comparison is done between the thin solder film plated member 30 (30 μm thickness) without the hot gas blow and the thin solder film plated member 10 (thickness equal or less than 2 μm) with the hot gas blow. Therefore, it can be verified that the thin solder film plated member 30 has the solder layer 7' of the film thickness 30 μm which is about three times of a scale display of 10 μm unit in the cross-sectional image of the magnification ratio 900 times. On the other hand, it can be verified that the thin solder film plated member 10 has the coated solder layer 7 equal to or less than 2 μm, i.e., about ⅕ of the scale display of 10 μm unit.

In the cross-sectional image of the magnification ratio 3000 times shown in FIG. 11B, the solder layer 7' of the thin solder film plated member 30 is out of the view field. However, in the thin solder film plated member 10 shown in FIG. 11D, it can be verified from the scale display of 1 μm unit that the solder layer 7' of about double thickness or equal to or less than 2 μm is adhered.

An element analysis result of the five-element solder composition solder layer 7' (#6064 solder) will be explained by comparing the element mapping image examples and their points' analysis table of the thin solder film plated members 10, 30 with and without the hot gas blow. This explanation will refer to FIG. 12A~FIG. 12I, FIG. 13A, FIG. 13B, FIG. 14A~FIG. 14I, FIG. 15A, FIG. 15B. The example of this element mapping image is formed by creating a picture of differences between X-ray emission volumes at points each scanned by an electron probe of using a counting rate of the predetermined energy X-ray as a signal in an element analyzing method using the X-ray.

This is, for example, a technique of getting a two-dimension element distribution image (Energy Dispersive X-ray Spectroscopy: EDS) by measuring an individual X-ray intensity of every element while scanning a specimen with an electron beam in two-dimension and by displaying, on the monitor, its brightness modulation based on the intensity in synchronism with the scanning signal.

Figure 12A:
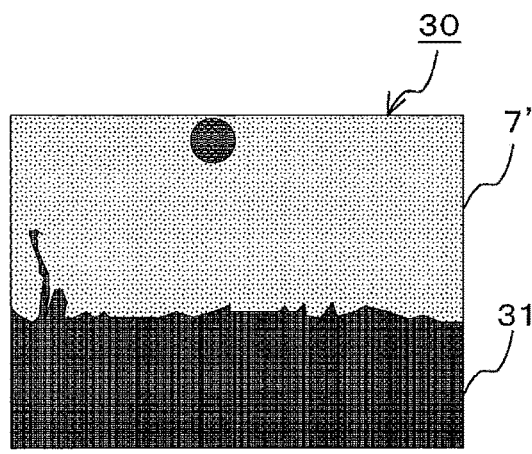
FIG. 12A is a photographic drawing illustrating an electron microscope image example of the thin solder film plated member 30 without the hot gas blow.
Figure 12B:
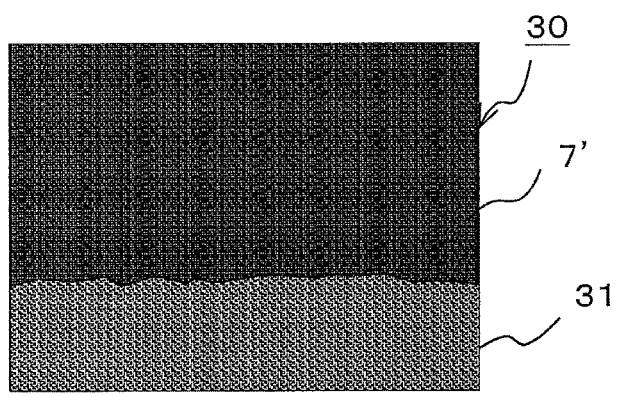
FIG. 12B is a photographic drawing illustrating its element mapping image example.
Figure 12C:
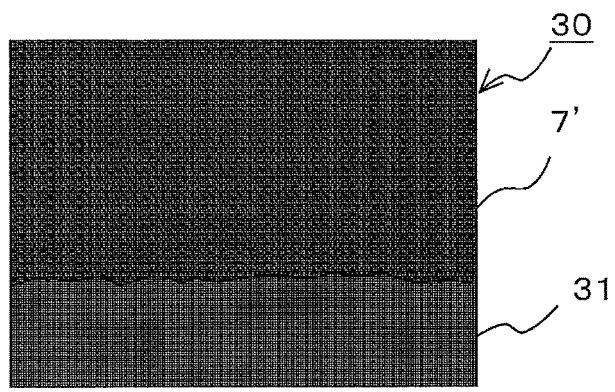
FIG. 12C is a photographic drawing illustrating its element mapping image example.
Figure 12D:
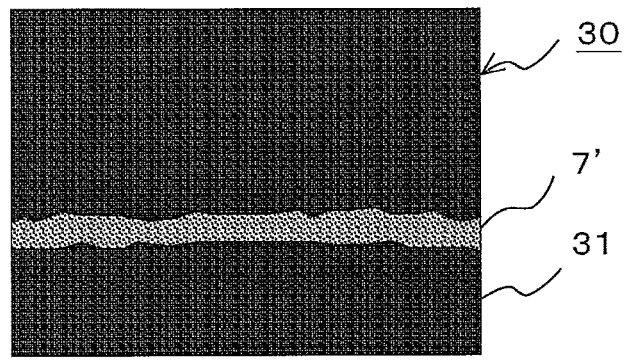
FIG. 12D is a photographic drawing illustrating its element mapping image example.
Figure 12E:
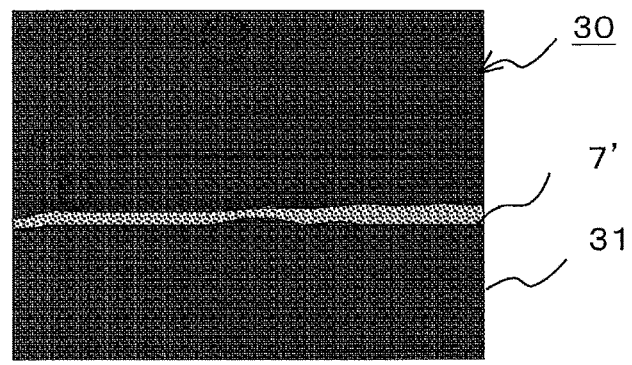
FIG. 12E is a photographic drawing illustrating its element mapping image example.

An example of the electron microscope image shown in FIG. 12A is a cross-sectional photographic drawing of the thin solder film plated member 30 without the hot gas blow wherein the solder layer 7' having film thickness of 30 μm is adhered to the member 30 and the magnification rate is 5000 times. FIG. 12B~FIG. 12I are element mapping image examples drawn with monochrome lines and are without the hot gas blow. These images configure the thin solder film plated member 30. These images are an image of Ka1-line representative of an X-ray characteristic of iron (Fe), an image of Ka1-line representative of an X-ray characteristic of cobalt (Co), an image of Ka1-line representative of an X-ray characteristic of nickel (Ni), an image of La1-line representative of an X-ray characteristic of tin (Sn), an image of Ma1-line representative of an X-ray characteristic of lead (Pb), an image of Ma1-line representative of an X-ray characteristic of bismuth (Bi), an image of La1-line representative of an X-ray characteristic of indium (In) and an image of La1-line representative of an X-ray characteristic of silver (Ag).

In a solder in which Bi is added to a Sn family alloy, a solder alloy having very wide milting point was formed conventionally. Thus, inspissation with and without the hot gas blow will be explained. The inspissation of Bi is a phenomenon wherein when the solder layer 7' is condensed, Bi concentrates on melt and inspissates. Presence or absence of Bi inspissate will be verified on the basis of concentration 10.0. An example determination is the presence of the inspissate for Bi concentration over 10.0 and absence of the inspissate for Bi concentration less than 10.0.

Figure 12F:
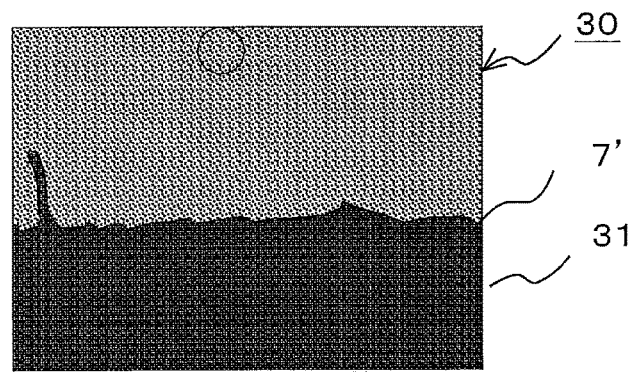
FIG. 12F is a photographic drawing illustrating its element mapping image example.
Figure 12G:
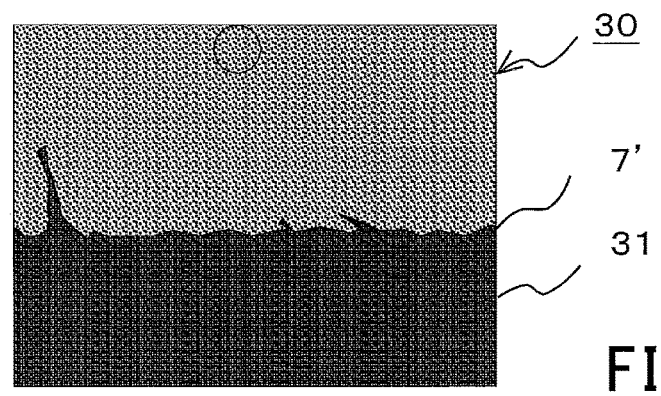
FIG. 12G is a photographic drawing illustrating its element mapping image example.
Figure 12H:
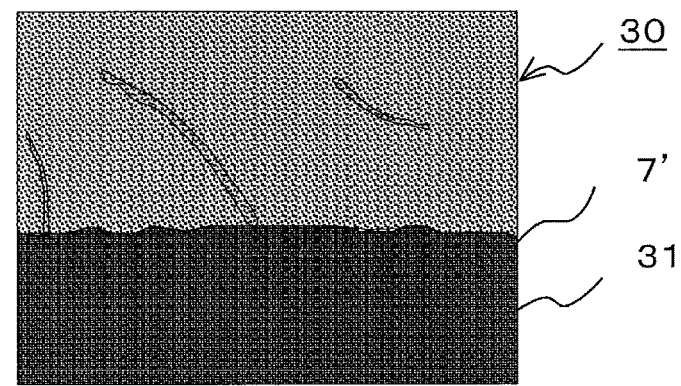
FIG. 12H is a photographic drawing illustrating its element mapping image example.
Figure 12I:
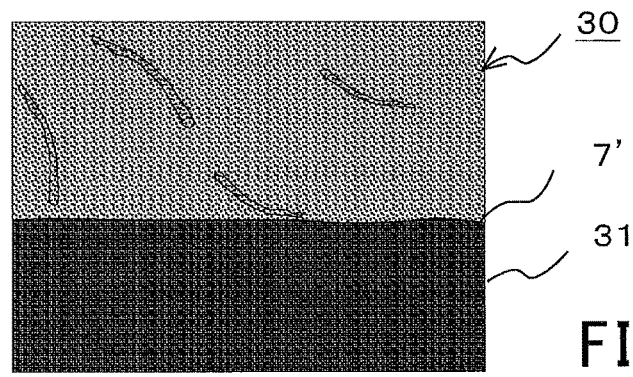
FIG. 12I is a photographic drawing illustrating its element mapping image example.

According to the Ma1-line photographic drawing of Pb shown in FIG. 12F and the Ma1-line photographic drawing of Bi shown in FIG. 12G, substantially equal element mapping image drawings are obtained (the Bi concentration is detected to be substantially equal to the Pb concentration). However, this is because the Pb energy peak is closes to the Bi energy peak. Then, the Bi concentration was verified by the point analysis shown in FIG. 13A and FIG. 13B.

Figure 13A:
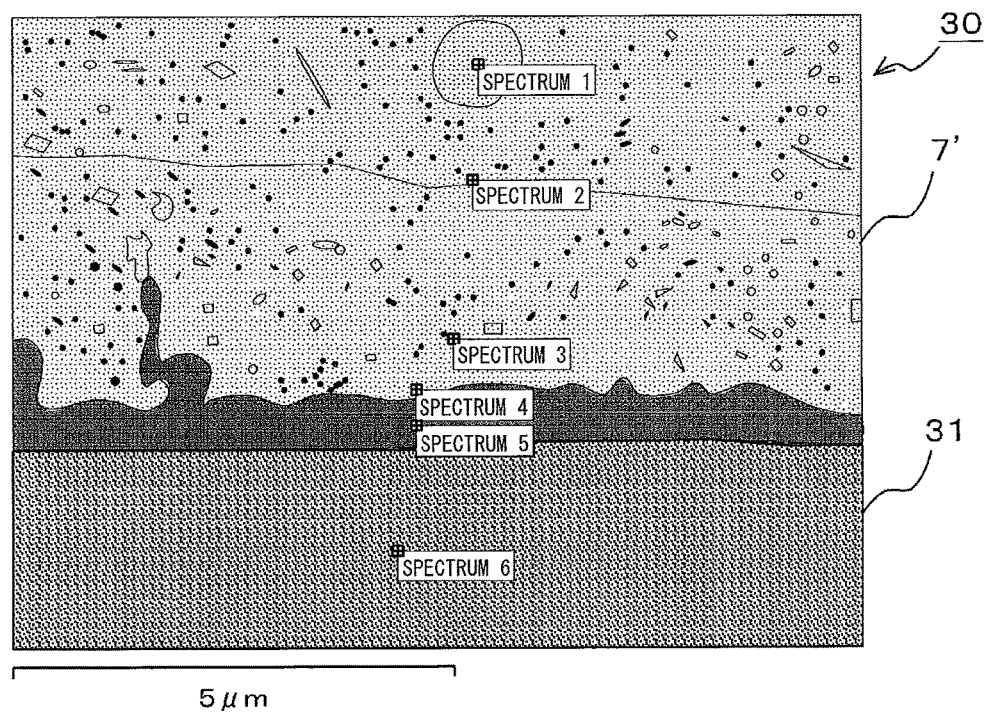
FIG. 13A is a photographic drawing illustrating an electron microscope image example of a cross sectional view of the thin solder film plated member 30 without the hot gas blow.

In the electron microscope image example shown in FIG. 13A, a ratio of elements Fe, Co, Ni, Ag, In, Sn, Pb, Bi (total=100, for example, parts per hundred %) was analyzed. They exist at six points, namely, three points (spectrum 1~spectrum 3) on the solder layer 7' without the hot gas blow, one point (spectrum 4) at a boundary between the solder layer 7' and the strip member 31 and two points (spectrum 5, spectrum 6) on the strip member 31.

Figures 13B, 14A:
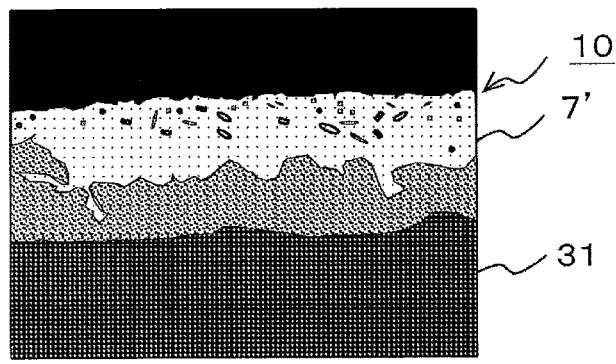
FIG. 13B is a table illustrating its point analysis example.
FIG. 14A is a photographic drawing illustrating an electron microscope image example of a cross sectional view of the thin solder film plated member 10 with the hot gas blow.

According to the table shown in FIG. 13B, the elements Fe, Co, Ni, Ag, In, Sn, Pb, Bi are written along the horizontal axis and the spectrums 1~6 are written along the vertical axis. In the spectrum 1, each of Fe, Co, Ni and Ag=0.00, In=2.90, Sn=85.14, Pb=11.96 and Bi=0.00 are written. In the spectrum 2, each of Fe, Co, Ni and Ag=0.00, In=2.83, Sn=2.47, Pb=94.70 and Bi=0.00 are written. In the spectrum 3, each of Fe, Co, Ni and Ag=0.00, In=2.58, Sn=2.64, Pb=93.19 and Bi=0.00 are written.

In the spectrum 4, Fe32 2.49, Co=0.00, Ag=0.00, In=2.06, Sn=30.91, Pb=46.42 and Bi=0.00 are written. In the spectrum 5, Fe=3.87, Co=0.00, Ni=96.13 and each of Ag, In, Sn, Pb and Bi=0.00 are written. In the spectrum 6, Fe=52.96, Co=17.16, Ni=29.88 and each of Ag, In, Sn, Pb and Bi=0.00 are written.

This table does not show the Bi inspissate in the solder layer 7' although it is shown in the element mapping image example from the result of the point analysis. It is verified that the Bi inspissate is not seen in the solder layer 7' with the hot gas blow similarly to the present invention. The following is the element mapping image example and its point analysis table of the thin solder film plated member 10 with the hot gas blow.

An electron microscope image example shown in FIG. 14A is a cross-sectional photographic drawing of the thin solder film plated member 10 having the solder layer 7' with the hot gas blow wherein the film thickness of the solder layer 7' is equal to or less than 2 μm and the magnification ratio of the image is 5000 times. According to this photographic drawing, it was verified that the Ni—Sn plating diffuses toward the molten solder 7 (#6064 solder) by comparison with the case without the hot gas blow. It may be considered that the molten solder 7 is exposed to the high temperature (300° C.) with the hot gas blow process, and the diffusion of Ni, Sn, etc. advances.

Each of the element mapping images shown in FIG. 14B~FIG. 14I is a monochrome line drawing of the thin solder film plated member 10 with the hot gas blow. These images are for Ka1line image of Fe, Ka1-line image for Co, Ka1-line image of Ni, La1-line image of Sn, Ma1-line image of Pb, Ma1-line image of Bi, La1-line image of In and La1-line image of Ag.

Figure 14B:
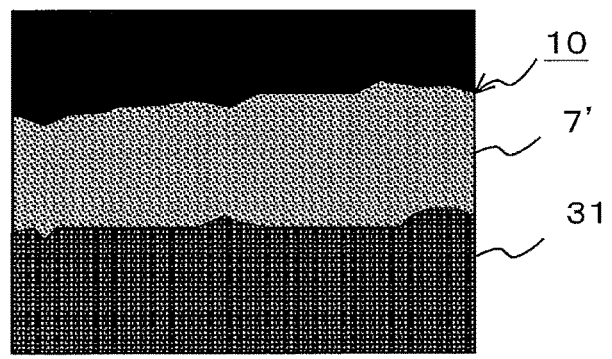
FIG. 14B is a photographic drawing illustrating its element mapping image example.
Figure 14C:
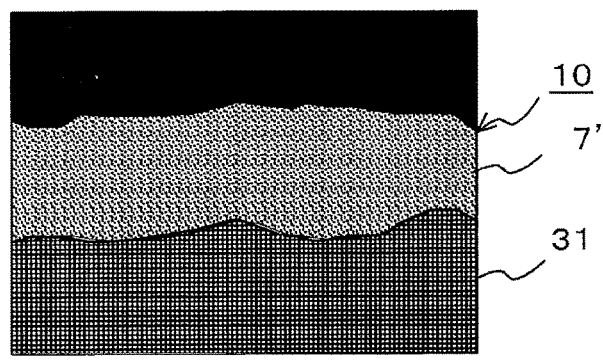
FIG. 14C is a photographic drawing illustrating its element mapping image example.
Figure 14D:
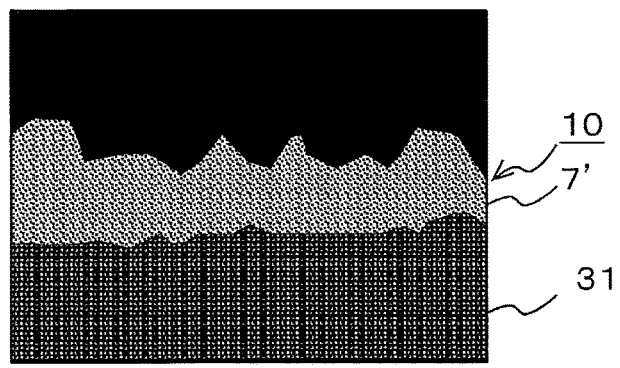
FIG. 14D is a photographic drawing illustrating its element mapping image example.
Figure 14E:
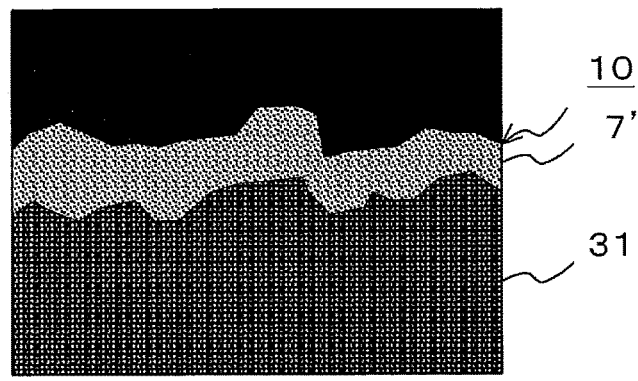
FIG. 14E is a photographic drawing illustrating its element mapping image example.
Figure 14F:
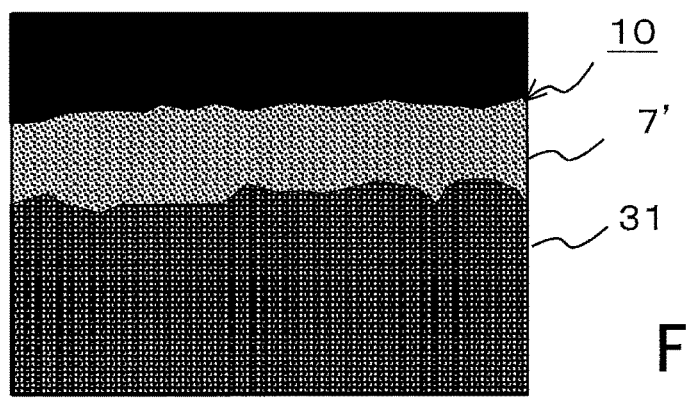
FIG. 14F is a photographic drawing illustrating its element mapping image example.
Figure 14G:
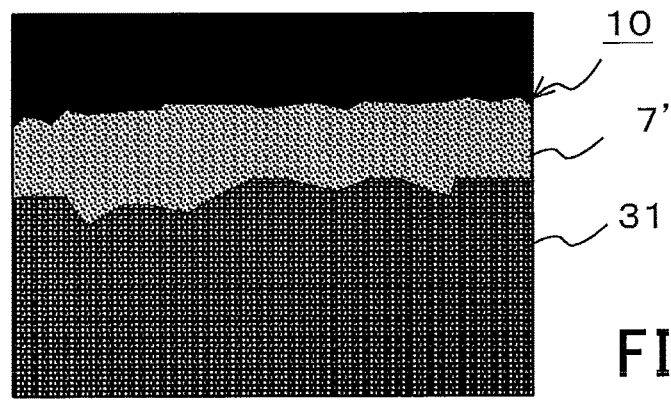
FIG. 14G is a photographic drawing illustrating its element mapping image example.
Figure 14H:
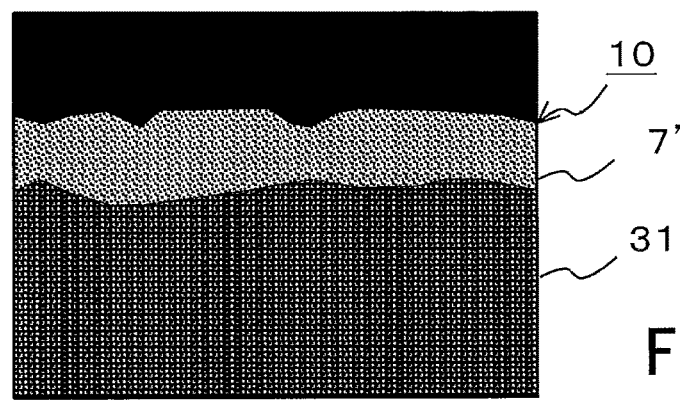
FIG. 14H is a photographic drawing illustrating its element mapping image example.
Figure 14I:
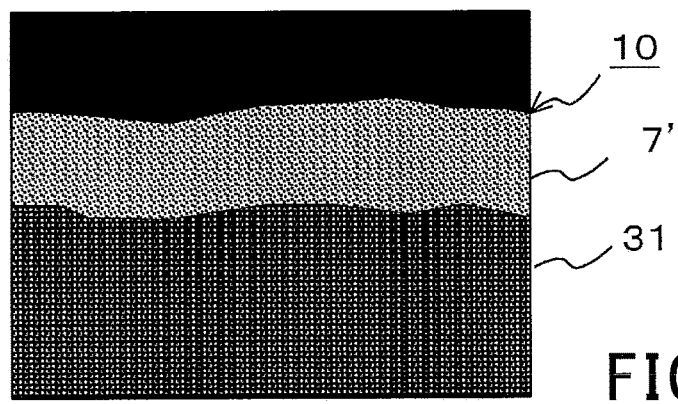
FIG. 14I is a photographic drawing illustrating its element mapping image example.

Again, substantially equivalent element mapping image examples are obtained according to the Ma1-line photographic drawing of Pb shown in FIG. 14G and the Ma1-line photographic drawing of Bi shown in FIG. 14G. However, the energy peaks of Pb and Bi are close to each other. Then, the Bi concentration was evaluated by the point analysis shown in FIG. 15A and FIG. 15B.

Rates of the elements Ag, In, Sn, Pb and Bi (total=100, for example, parts per hundred) were analyzed. Their positions are four points (Spectrum 2~Spectrum 5) on the solder layer 7' with the hot gas blow in an electron microscope image example shown in FIG. 15A.

Figures 15A, 15B:
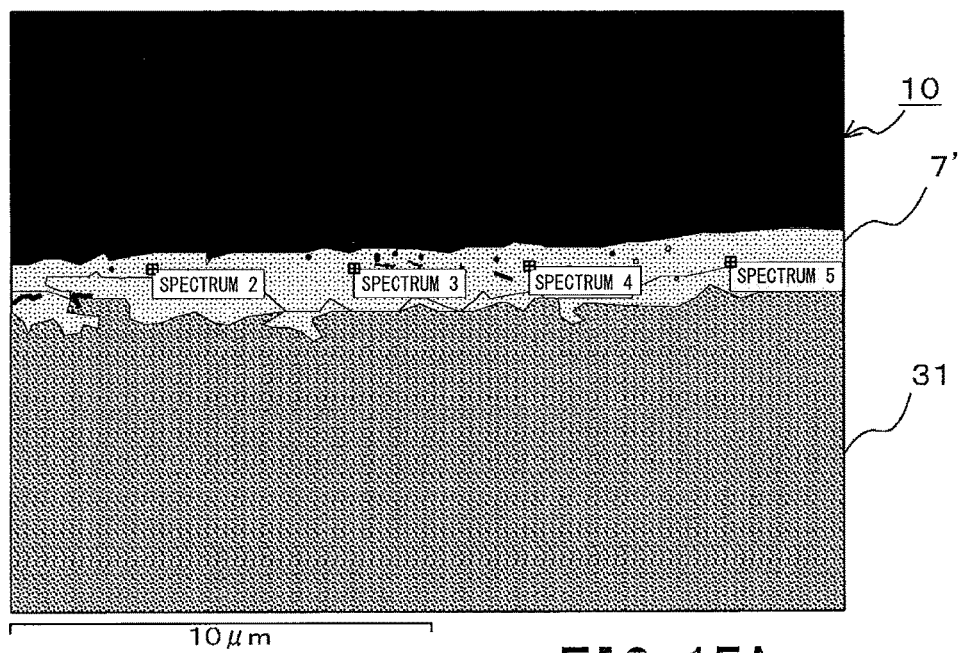
FIG. 15A is a photographic drawing illustrating an electron microscope image example of a cross sectional view of the thin solder film plated member 10 with the hot gas blow.
FIG. 15B is a table illustrating its point analysis example.

In a table of FIG. 15B, the elements Ag, In, Sn, Pb, Bi are written along the vertical axis and the spectrum 2~5 are written along the horizontal axis. In the spectrum 2, Ag=0.00, In=2.74, Sn=4.24, Pb=93.02 and Bi=0.00 are written. In the spectrum 3, Ag=0.00, In=2.64, Sn=3.50, Pb=87.58 and Bi=3.90 are written.

In the spectrum 4, Ag=0.00, In=2.40, Sn=3.48, Pb=94.12 and Bi=0.00 are written. In the spectrum 5, Ag=0.00, In=2.59, Sn=5.14, Pb=92.27 and Bi=0.00 are written. According to the above-described point analysis, it is verified that there is no Bi concentration in the solder layer 7' with the hot gas blow.

The embodiment of the hot-dip plating apparatus 100 for plating the thin molten solder film comprises the blower section 19 for blowing the N2 gas on the strip member 31 pulled up from the solder bath 17 wherein the N2 gas has the temperature T1=300° C. corresponding to, for example, the five-element solder composition (Pb-0.5Ag-3Bi-2IN-4Sn) and the flow volume Q1=60 NL/min.

According to this configuration, the excess molten solder 7 can be trimmed from the strip member 31 corresponding to the five-element solder composition, so that the film thickness of the molten solder 7 coated on the strip member 31 can be controlled evenly and equal to or less than 2 μm. Therefore, the thin solder film plating with the film thickness extremely thinner than the conventional system can be achieved. In addition, a manufacturing takt time can be reduced and a manufacturing total cost can be also reduced. Thin molten solder plating can be achieved on the base material in increments of a few μm over a short time not depending on electroplated coating, non-electrolytic plating and the like.

According to the thin solder film plated member 10 and the manufacturing method thereof of the embodiment, the N2 gas is blown on the strip member 31 immediately after being pulled up from the solder bath 17 that accommodates the molten solder. The N2 gas has the temperature T1=300° C. equal to or higher than the melting temperature corresponding to composition of the molten solder 7 (#6064 solder) and also has the predetermined flow volume Q1=60 NL/min. Therefore, the film thickness of the molten solder 7 on the thin solder film plated member 10 can be controlled.

This configuration can manufacture the thin solder film plated member 10 having the thin-film solder layer 7' whose coated surface is excellent in stability and flatness with respect to the conventional system. Therefore, the material for the shield case for electronic circuits of cell phones, game machines and the like can be manufactured in good reproducibility.

The #6064 solder has been explained for the molten solder 7. However, the present invention can be applied to the other types, such as the five-element family Pb-1Ag-8Bi-1In-4Sn type #6038 solder having the melting temperature 250~296° C. (manufacture by Senju Metal Industry Co., Ltd.), two-element family Sn-5Sb type M10 solder having the melting temperature 240~243° C. (manufacture by Senju Metal Industry Co., Ltd.), three-element family Sn-3Ag-0.5Cu type M705 solder having the melting temperature 217~220° C. (manufacture by Senju Metal Industry Co., Ltd.), etc.

In addition, constructions such as a hopper, a drain and the like may be provided between the arranged positions of the gas nozzles 91, 92 and the upper position of the chamber 16. The hopper or the like may collect the droplet component (droplet material) of the trimmed molten solder 7. A conveying pathway extended from the construction may lead (return) actively the droplet material to the solder bath 17. By keeping the construction at an enough temperature, the droplet material can be prevented from being solidified.

Moreover, the hot air such as the N2 gas effects the trimming of the molten solder 7 as well as the air curtain. The air curtain function prevents the droplet material from flying apart toward the upper portions of the gas nozzles 91, 92 wherein the hot air trims the droplet material.

The solder bath may be another type of solder bath having a jet nozzle and jetting the molten solder from the nozzle. This type effects to suppress the generation of an oxidized material, namely, dross on the surface of the solder. Normal air instead of the inactive gas may be used as the hot gas for the molten solder. In this case, if the droplet material (oxidized material) drops in the solder bath 17, the oxidized material drifts on the surface of the molten solder in the solder bath 17 but does not mix with the molten solder 7. If the oxidized material adheres to the main body 101, the gas nozzles 91, 92 can remove it easily.

INDUSTRIAL AVAILABILITY

The present invention trims the excess molten solder with the hot gas blow to achieve the thin-film solder plating on the base material. Therefore, the present invention is preferable to apply the system of manufacturing the thin solder film plated member.

EXPLANATION OF REFERENCE CODES

1: system for manufacturing a thin solder film plated member
1: strip member (base material)
7: molten solder
7': solder layer
10: thin solder film plated member
11: washing tank
12: dryer section
13: first conveying section
14: longitudinal member
15: preheating member
16: chamber
17: solder bath
19: blower section
20: cooling section
21: first fan
22: second fan
23: second conveying section
41, 44, 45-48: conveying rollers
42, 43: projections
65: bearing member
71: jet nozzle
90: hot gas adjustment section
91, 92: gas nozzles
93, 94: conduits
95, 96: heaters
97, 98: flow volume adjustment bulbs
100: hot-dip plating apparatus for plating a thin molten solder film

The invention claimed is:

1. A hot-dip plating apparatus for plating a thin molten solder film that manufactures a thin solder film plated member by cooling down a base material after coating the washed base material with the molten solder heated to a predetermined temperature, comprising:
    a solder bath for, for in an inactive atmosphere, accommodating the molten solder to coat with the solder by dipping the base material;
    a cover section for covering the upper portion of said solder bath and having an inlet port for the base material moving toward said solder bath and an outlet port from said solder bath;
    a bearing member united with said cover section at the solder bath side of said cover section and supporting a shaft of a roller so as to turn said base material around, to convey it from the inlet port of said cover section to a side of said solder bath and further convey it to the outlet port from the side of said solder bath;
    a longitudinal member provided at the side of said solder bath facing said bearing member with respect to said cover member, said cover section and said bearing member being able to slide with said longitudinal member in a unified manner;
    a first conveying section provided at an upstream side of said solder bath for applying a predetermined tension to the base material that is to be conveyed to said solder bath, a part of the plating apparatus nearer to the inlet port being the upstream side and a part of the plating apparatus nearer to the outlet port being the downstream side;
    a second conveying section provided at the downstream side of said solder bath for conveying the base material while drawing up the base material from said solder bath at a predetermined speed with the tension applied;
    a blower section for blowing hot gas on the base material immediately after being drawn up from said solder bath by said second conveying section, the hot gas having a predetermined flow volume and a temperature set to be equal to or higher than a melting temperature corresponding to the composition of the molten solder; and
    a control section for controlling the temperature and flow volume of the hot gas used to trim the molten solder from the base material so as to control the film thickness coated on the base material.

2. The hot-dip plating apparatus for plating the thin molten solder film according to claim 1, further comprising:
    a cooling section for cooling down the base material whose film thickness is controlled by said control section.

3. The hot-dip plating apparatus for plating the thin molten solder film according to claim 1 characterized in that inactive gas is used as the hot gas.

4. A method of manufacturing a thin solder film plated member by coating a washed base material with a molten solder heated to a predetermined temperature and then cooling down the base material, the method comprising:
    a step of conveying the base material at a predetermined speed through a bearing member and a longitudinal member and dipping it in a solder bath located in an inactive atmosphere, a predetermined tension being applied to the base material, said bearing member and said longitudinal member being united with a cover section that covers an upper portion of the solder bath, said bearing member supporting a shaft of a roller that turns the base material around;
    a step of drawing up the base material dipped in said solder bath from said solder bath; and
    a step of controlling a film thickness of the molten solder coating the base material by blowing hot gas on the base material immediately after drawing up the base material in order to trim the molten solder from the base material, the hot gas being set to have a temperature equal to or higher than a melting temperature of the composition of the molten solder and being controlled to have a predetermined flow volume.

5. A method for providing a thin film of solder plating, comprising:
    providing a washed base material;
    providing a layer of solder on the base material by coating the base material with a film of molten solder;
    controlling a thickness of the film of molten solder, by:
        providing molten solder heated to a predetermined temperature in a solder bath;
        containing the solder bath in an inactive atmosphere;
        conveying the washed base material to the molten solder bath at a predetermined speed around a roller whose shaft is supported by a bearing member, and through a longitudinal member, while applying a predetermined tension on the base material in the solder bath, said bearing member and said longitudinal member being united with a cover section that covers an upper portion of the solder bath, and said roller turning the base material around;

dipping the base material in the molten solder bath;

blowing hot gas on the base material immediately after drawing up the base material from said solder bath and thereby trimming the molten solder from the base material so that the coating layer has a predetermined film thickness, the hot gas having a predetermined flow volume and a temperature equal to or higher than a melting temperature corresponding to the composition of the molten solder.

* * * * *

UNITED STATES PATENT AND TRADEMARK OFFICE
CERTIFICATE OF CORRECTION

PATENT NO. : 9,956,634 B2
APPLICATION NO. : 14/407040
DATED : May 1, 2018
INVENTOR(S) : Isamu Sato et al.

It is certified that error appears in the above-identified patent and that said Letters Patent is hereby corrected as shown below:

In the Claims

Column 21, Line 53: Delete the second occurrence of the word "for".

Signed and Sealed this
Ninth Day of April, 2019

Andrei Iancu
*Director of the United States Patent and Trademark Office*